(12) United States Patent
Hashimoto et al.

(10) Patent No.: US 7,383,751 B2
(45) Date of Patent: Jun. 10, 2008

(54) ARTICULATED ROBOT

(75) Inventors: Yasuhiko Hashimoto, Kobe (JP); Eiichi Yamaki, Akashi (JP)

(73) Assignee: Kawasaki Jukogyo Kabushiki Kaisha, Kobe-shi (JP)

( * ) Notice: Subject to any disclaimer, the term of this patent is extended or adjusted under 35 U.S.C. 154(b) by 578 days.

(21) Appl. No.: 10/889,079

(22) Filed: Jul. 13, 2004

(65) Prior Publication Data

US 2005/0011294 A1   Jan. 20, 2005

(30) Foreign Application Priority Data

Jul. 14, 2003   (JP) .............. 2003-274371

(51) Int. Cl.
*B25J 17/00* (2006.01)
*B66C 23/00* (2006.01)

(52) U.S. Cl. .............. 74/490.01; 901/15; 901/25; 414/744.6; 414/744.7

(58) Field of Classification Search .......... 74/490.01, 74/490.05, 490.13; 414/744.5, 744.6, 744.7; 901/15, 25, 28

See application file for complete search history.

(56) References Cited

U.S. PATENT DOCUMENTS

| | | | |
|---|---|---|---|
| 5,064,340 A | | 11/1991 | Genov et al. |
| 5,534,761 A | * | 7/1996 | Crippa ..................... 318/568.1 |
| 5,993,142 A | * | 11/1999 | Genov et al. ............. 414/744.5 |
| 6,059,517 A | * | 5/2000 | Begin ....................... 414/744.6 |
| 6,105,454 A | * | 8/2000 | Bacchi et al. ............ 74/490.03 |
| 6,491,491 B1 | * | 12/2002 | Tsuneda et al. .......... 414/744.5 |

FOREIGN PATENT DOCUMENTS

| | | |
|---|---|---|
| JP | A 63-272474 | 11/1988 |
| JP | A 04-092446 | 3/1992 |
| JP | A 05-036811 | 2/1993 |
| JP | A 08-172121 | 7/1996 |
| JP | A 09-102526 | 4/1997 |
| JP | A 9-102526 | 4/1997 |
| JP | A 10-329062 | 12/1998 |
| JP | A 11-138472 | 5/1999 |
| JP | A 2000-237988 | 9/2000 |
| JP | A 2001-137181 | 5/2001 |

(Continued)

*Primary Examiner*—Richard W L Ridley
*Assistant Examiner*—Justin Krause
(74) *Attorney, Agent, or Firm*—Oliff & Berridge, PLC

(57) ABSTRACT

An articulated robot is provided with first, second and third arms respectively having effective lengths substantially equal to each other and capable of turning respectively about first, second and third pivotal axes. The second and the third arm are interlocked by an interlocking mechanism such that the third arm turns about a third pivotal axis relative to the second arm in one of opposite directions through an angle twice as large as an angle through which the second arm turns about a second pivotal axis relative to the first arm in the other direction. The second arm 25 and the third arm 26 are moved in either of first and second working areas respectively extending on the opposite sides of an imaginary plane including a reference line and the first pivotal axis to move hand units along the reference line. Since the second and the third arm are necessarily only in one of the first and the second working region, the articulated robot is capable of operating in a narrow working area.

4 Claims, 15 Drawing Sheets

FOREIGN PATENT DOCUMENTS

| | | |
|---|---|---|
| JP | A 2001-310287 | 11/2001 |
| JP | A 2002-066966 | 3/2002 |
| JP | A 2002-522238 | 7/2002 |
| JP | A 2003-220586 | 8/2003 |
| JP | A 2004-235538 | 8/2004 |
| WO | WO 00/07780 | 2/2000 |

* cited by examiner

ARTICULATED ROBOT

BACKGROUND OF THE INVENTION

1. Field of the Invention

The present invention relates to an articulated robot and, more particularly, to an articulated robot for carrying a substrate, such as a semiconductor wafer.

2. Description of the Related Art

FIG. 15 shows a prior art articulated robot 1 disclosed in JP-A No. 2001-137181 in a plan view. The articulated robot 1 is used for carrying a semiconductor wafer 2. The articulated robot 1 has a first arm 3, a second arm 4, a third arm 5, a hand unit 6 for holding the wafer 2, and a base 7. The articulated robot 1 moves the hand unit 6 holding the semiconductor wafer 2 in predetermined first directions X along a straight path. The first arm 3 has a base part 3a pivotally supported on the base 7, and a front part 3b. The second arm 4 has a base part 4a and a front part 4b, the third arm 5 has a base part 5a and a front part 5b, and the hand unit 6 has a base part 6a. The front part 3b of the first arm 3 and the base part 4a of the second arm 4 are pivotally connected together. The front part 4b of the second arm 4 and the base part 5a of the third arm 5 are pivotally connected together. The front part 5b of the third arm 5 and the base part 6a of the hand unit 6 are pivotally connected together.

The base 7 has a first axis L1 and the first arm 3 turns about the first axis L1. The first arm 3 has a second axis L2 and the second arm 4 turns about the second axis L2. The second arm 4 has a third axis L3 and the third arm 5 turns about the third axis L3. The third arm 5 has a fourth axis L4 and the hand unit 6 turns about the fourth axis L4. The distance N1 between the first axis L1 and the second axis L2, the distance N2 between the second axis L2 and the third axis L3 and the distance N3 between the third axis L3 and the fourth axis L4 are in the ratio of 2:2:1.

When the hand unit 6 moves straight in the first direction X, a middle point 8 of the second arm 4 moves along a reference line 9 perpendicularly intersecting the first axis L1; that is, the respective angular speeds of the first arm 3, the second arm 4, the third arm 5 and the hand unit 6 are in the ratio of 1:2: 2:1.

FIG. 16 shows an articulated robot 1 in a first modification of the articulated robot 1 shown in FIG. 15. Referring to FIG. 16, a first arm 3, a second arm 4 and a third arm 5 extend straight along a reference line 9 parallel to first directions when a hand unit 6 is moved to a position farthest from a base 7. When a wafer 2 held by the hand unit 2 is moved in the first direction X toward or away from the base 7, a first joint 11 joining the first arm 3 and the second arm 4 move in a second direction Y1 with respect to the base 7, while a second joint 12 joining the second arm 4 and the third arm 5 moves in a second direction Y2 opposite the second direction Y1. When a third joint 13 joining the hand unit 6 and the third arm 5 is moved toward the base 7, the first joint 11 moves away from the reference line 9 in the second direction Y1, the second joint 12 moves away from the reference line 9 in the second direction Y2. In some cases, the distance B1 between the reference line 9 and the second joint 12 and the distance B2 between the reference line 9 and the first joint 11 are longer than the distance A1 between the reference line 9 and one end of a diameter of the wafer 2 and the distance A2 between the reference line 9 and the other end of the diameter as shown in FIGS. 16(2) to 16(4). In such cases, the articulated robot 1 needs an working area of a width in the second directions Y1 and Y2 greater than a width equal to the sum of the distances B1 and B2 in the opposite second directions Y1 and Y2 in which the first joint 11 and the second joint 12 move with respect to the reference line 9 in order that the first joint 11 and the second joint 12 may not interfere with other devices installed around the articulated robot 1 when the first joint 11 and the second joint 12 are moved in the second directions Y1 and Y2.

FIG. 17 shows an articulated robot 1 in a second modification of the prior art articulated robot 1 in a plan view. The articulated robot 1 can be changed from a left-hand system in which the first joint 11 is moved in the second direction Y1 to a right-hand system in which the first joint 11 is moved in the second direction Y2, and vice versa. As shown in FIG. 17(1), the articulated robot 1 cannot be changed from the right-hand system to the left-hand system in a state where the radius of turning circle having its center on a first axis L1 is a minimum.

Arms 3 to 5 extended in a state shown in FIG. 17(1) need to be extended in a line along a reference line 9 as shown in FIG. 17(2) when the articulated robot 1 is changed from the left-hand system to the right-hand system. Thus, an additional operation is needed to change the articulated robot 1 from the right-hand system to the left-hand system and hence the articulated robot 1 cannot be changed in a short time from the right-hand system to the left-hand system. The change of the articulated robot 1 from the left-hand system to the right-hand system needs a similar operation and has a similar problem.

In a state shown in FIG. 17(2) permitting changing the articulated robot 1 from the right-hand system to the left-hand system, the arms 3 to 5 are extended along the reference line 9 and the distance D along the first direction between a base 7 and a third joint 13 is greater than a minimum radius C of a turning circle. Therefore, the articulated robot 1 needs a working area greater than the distance D in the first direction between the base 7 and the third joint 13 around the articulated robot 1 in order to prevent the interference of the articulated robot 1 with devices installed around the articulated robot 1 in changing the articulated robot 1 between the right-hand system and the left-hand system.

Thus, the known articulated robot 1 needs a large working area. When the articulated robot 1 is used in a housing through which clean air flows, the housing must be large and the efficiency of cleaning the interior of the housing with clean air is low. The ratio of the working area of the articulated robot 1 to an internal space in the housing is large and only a small space is available for installing other processing devices in the housing.

SUMMARY OF THE INVENTION

Accordingly, it is an object of the present invention to provide an articulated robot capable of operating in a small working area.

An articulated robot according to the present invention includes: a base unit having a predetermined first pivotal axis and capable of turning about the first pivotal axis; a first arm having a base part connected to the base unit, and a front part having a second pivotal axis parallel to the first pivotal axis; a second arm having a base part connected to the front part of the first arm, and a front part having a third pivotal axis parallel to the first pivotal axis, and capable of turning about the second pivotal axis; a third arm having a base part connected to the front part of the second arm and capable of turning about the third pivotal axis; an interlocking means interlocking the second and the third arm such that the third arm turns about the third pivotal axis relative to the second arm in one of opposite directions through an angle twice as large as an angle through which the second arm turns about the second pivotal axis relative to the first arm in the other direction; a base unit driving means for turning the base unit about the first pivotal axis; and an arm driving means for turning the second arm about the second pivotal axis; wherein distance between the pivotal axes of the first and the second arm is substantially equal to that between the pivotal axes of the second and the third arm.

In the articulated robot according to the present invention, the respective effective lengths of the first, the second and the third arm are selectively determined such that the radius of a circle having its center on the first pivotal axis in which the first, the second and the third arm turn is a minimum in a state where the first, the second and the third arm are in angular positions such that a direction from the base part toward the front part of each of the second and the third arm is opposite to a direction from the base part toward the front part of the first arm.

The articulated robot according to the present invention further includes an end effector that comes into contact with a workpiece and does work on the workpiece, and an end effector driving means for turning the end effector; wherein the third arm has a front part having a fourth pivotal axis parallel to the first pivotal axis, and the end effector driving means turns the end effector about the fourth pivotal axis.

In the articulated robot according to the present invention, the first arm is separable from the base unit and the second arm, a base part of the second arm can be connected to the base unit, the second arm can be turned about the first pivotal axis when the second arm is connected to the base unit, the interlocking means turns the third arm about the third pivotal axis relative to the second arm in one of opposite directions through an angle twice as large as an angle through which the second arm turns about the second pivotal axis relative to the first arm in the other direction.

In the articulated robot according to the present invention, the interlocking means includes a gear mechanism capable of transmitting driving force of the arm driving means to the second and the third arm.

The articulated robot according to the present invention can be installed in a narrow limited space.

The articulated robot according to the present invention is installed in a housing defining a space of a predetermined atmosphere.

According to the present invention, the distance between the base unit and the front part of the third arm can be changed by turning the second and the third arm. The front part of the third arm can be turned about the first pivotal axis by turning the base unit about the first pivotal axis. Thus, it is possible to realize a horizontal articulated robot having a robot arm and capable of turning a front part of the robot arm in a plane perpendicular to a first pivotal axis in a cylindrical coordinate system. An end effector, such as a robot hand, is attached to a front part of a third arm. Any end effector does not need to be mounted on the front part of the third arm.

The second and the third arm can be positioned in one of first and second working areas divided by an imaginary plane including a reference line and the first pivotal axis and the front part of the third arm can be moved along the reference line by turning the second arm about the second pivotal axis in a first circumferential direction relative to the first arm in a state where the arms are arranged in a line along the reference line and the front part of the third arm is at the longest distance from the base unit.

The second and the third arm can be positioned in the other of the first and the second working area and the front part of the third arm can be moved along the reference line by turning the second arm about the second pivotal axis in a second circumferential direction opposite the first circumferential direction relative to the first arm in the in a state where the arms are arranged in a line along the reference line and the front part of the third arm is at the longest distance from the base unit.

Supposing that there is an obstacle or a wall in one of the two working areas, the end effector can be moved along the reference line with the second and the third arm placed in the other working area. Thus, the articulated robot is able to operate such that the working area is not included in either of the two working areas and arms are able to operate in a narrow space by selecting a area in which the second and the third arm are place.

When the articulated robot and other devices are disposed in a predetermined space, a large space can be allocated to the devices other than the articulated robot. The predetermined space may be small. When the articulated robot and the other devices are installed in a space defined by a housing and filled up with clean air, the interior of the housing can be efficiently cleaned because the housing may be small. When all the arms are extended in a line such that the first arm is extended in one of opposite directions and the second and the third arm are extended in the other direction, the arms turn about the pivotal axes along circles of minimum radii, respectively. The second and the third arm can be shifted from one of the two working areas to the other by changing the turning direction of the second arm. Thus, the articulated robot can be changed from the right-hand system in which the second and the third arm are in one of the two working areas to the left-hand system in which the second and the third arm are in the other working area in a state where the working area is a minimum. Therefore, any additional working area is not necessary for changing the working area in which the second and the third arm are placed, and hence the working area may be small.

According to the present invention, the position of the end effector can be optionally determined when the end effector is positioned at a predetermined position because the end effector can be turned about the fourth pivotal axis relative to the third arm. Thus, the end effector can be set in a predetermined position at the predetermined position, which improves the convenience of the articulated robot.

The articulated robot of the present invention is suitable for use as a robot provided with an end effector, such as a carrier robot or a painting robot.

The articulated robot of the present invention can be changed into an articulated robot having two arms by separating the first arm fro the base unit and the second arm, and connecting the second arm to the base unit. Thus, a three-arm articulated robot and a two-arm articulated robot can be built by assembling common parts at a reduced production cost. Since the two-arm articulated robot can be readily changed into the three-arm articulated robot, any additional articulated robot does not need to be purchased and hence equipment cost can be reduced.

The use of the gear mechanism for transmitting driving force increases the rigidity of the second and the third arm. Even if the second and the third arm are turned about their pivotal axes at a high angular speed, the second and the third arm can be stably turned about their pivotal axes and moving speed can be increased.

The second and the third arm can be shifted from one of the two working areas to the other by turning the second arm in a state where the radius of the turning circle is a minimum to change the articulate robot from the right-hand system into the left-hand system and vice versa. Thus, the articulated robot can be operated in a narrow limited space. The narrow limited space is, for example, narrower than a maximum available working area in which the robot arm operates. The maximum available working area is defined by a circle along which the front part of the second arm moves when the base unit is turned about the first pivotal axis with the front part of the second arm positioned at the longest distance from the base unit.

The articulated robot of the present invention having a reach equal to that of the conventional articulated robot can operate in a working area narrower than that needed by the conventional articulated robot. Therefore, the articulated robot of the present invention is suitable for carrying a semiconductor wafer. Even if the articulated robot is operated in a narrow space in the housing, the articulated robot operates satisfactorily and hence the housing may be small.

BRIEF DESCRIPTION OF THE DRAWINGS

The above and other objects, features and advantages of the present invention will become more apparent from the following description taken in connection with the accompanying drawings, in which.

DESCRIPTION OF THE PREFERRED EMBODIMENTS

Figure 1:
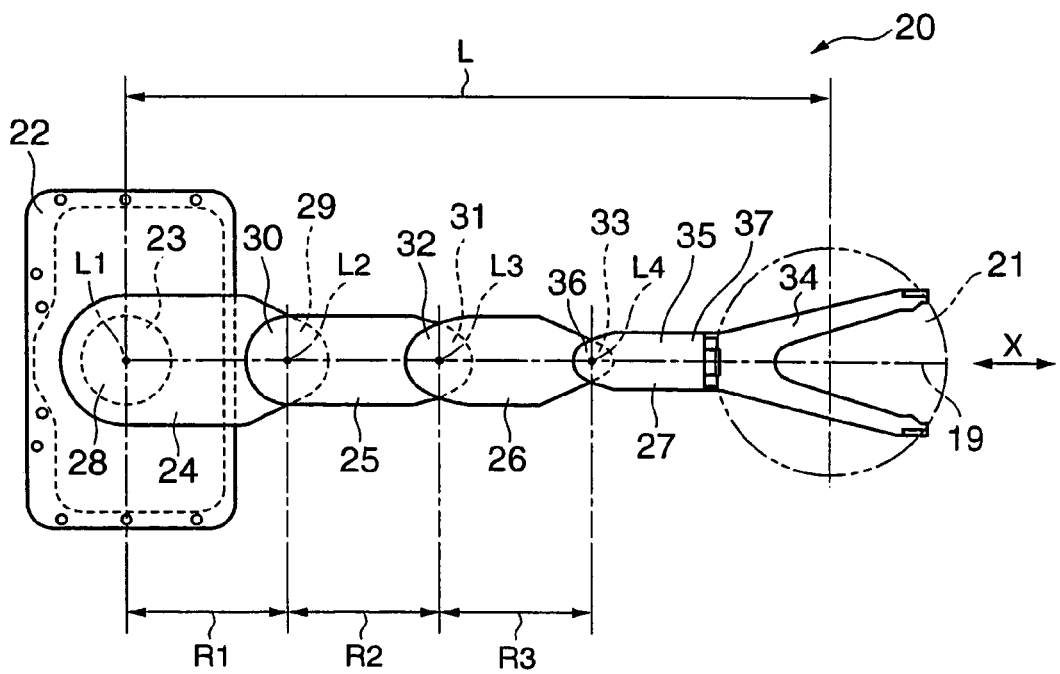
FIG. 1 is a plan view of an articulated robot in a preferred embodiment according to the present invention.
Figure 2:
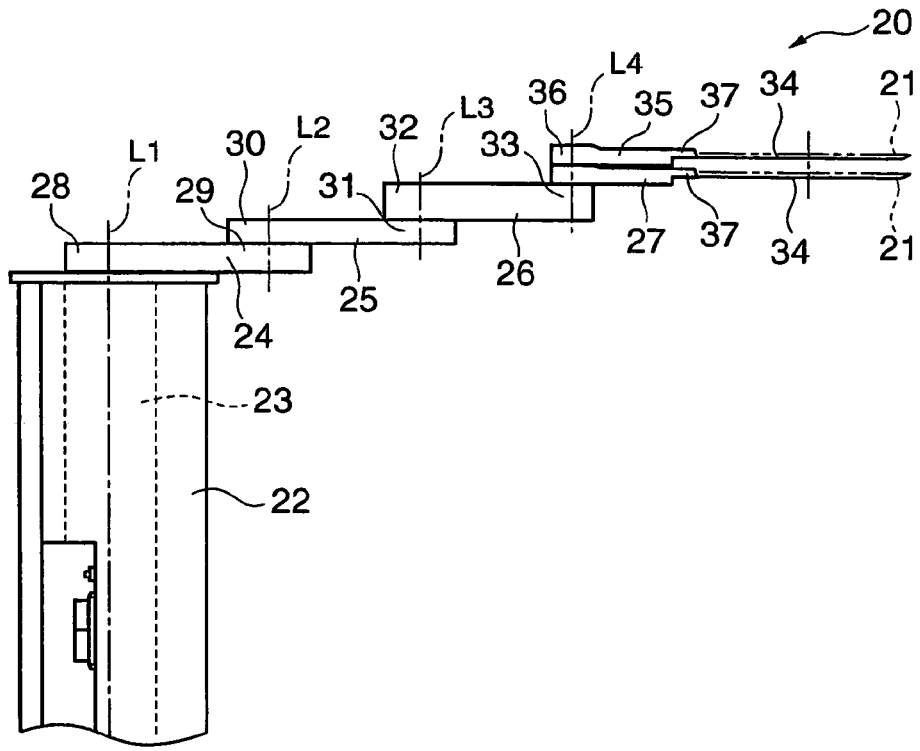
FIG. 2 is a side elevation of the articulated robot shown in FIG. 1.
Figure 3:
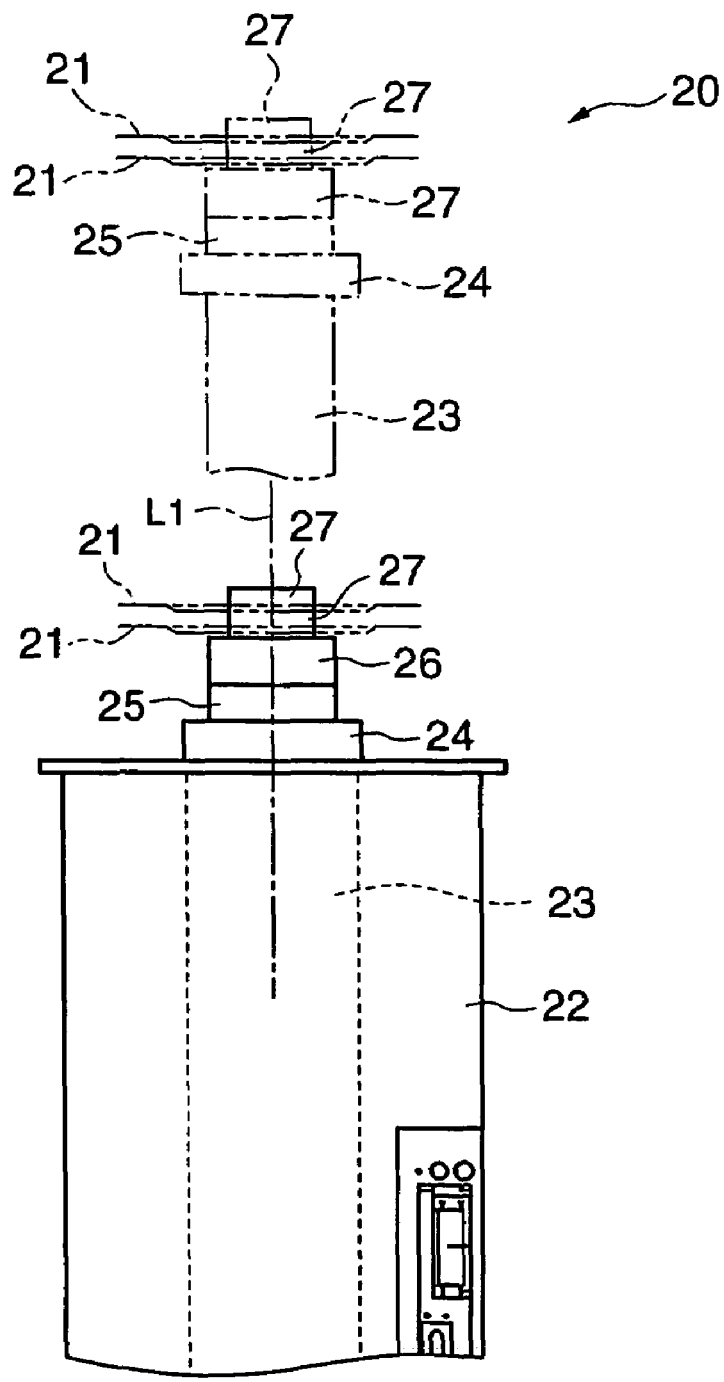
FIG. 3 is a back view of the articulated robot shown in FIG. 1.

FIG. 1 is a plan view of an articulated robot 20 in a preferred embodiment according to the present invention, FIG. 2 is a side elevation of the articulated robot 20 and FIG. 3 is a back view of the articulated robot 20. The articulated robot 20 of the present invention is used, for example, as a substrate carrying robot provided with a robot hand for holding a workpiece, such as a silicone wafer, a substrate for forming a photomask or a glass substrate for a liquid crystal display. The articulated robot 20 holds a semiconductor wafer 21 and carries the semiconductor wafer 21 along a predetermined carrying path. The articulated robot 20 has a base 22, a base unit 23, a robot arm including a first arm 24, a second arm 25 and a third arm 26, and two hand units 27. The base 22 is fixedly attached to a housing containing the articulated robot 20. The base unit 23 is connected to the base 22 so as to turn about a first pivotal axis L1 relative to the base 22. In this embodiment, the first pivotal axis is vertical. A reference line 19 extends perpendicularly to the first pivotal axis L1 and turns together with the base unit 23 about the first pivotal axis L1.

The three arms 24, 25 and 26 have elongate shapes, respectively. The first arm 24 is detachably attached to the base unit 23 so as to extend along the reference line 19. The first arm 24 has a base part detachably connected to the base unit 23, and a front part 29 having a second pivotal axis L2 parallel to the first pivotal axis L1 and perpendicular to the reference line 19. The second arm 25 has a base part 30 connected to the front part 29 of the first arm 24 so as to be turnable about the second pivotal axis L2. The second arm 25 has a front part 31 having a third pivotal axis L3 parallel to the first pivotal axis L1. The third arm has a base part 32 connected to the front part 31 of the second arm 25 so as to turn about the third pivotal axis L3 relative to the second arm 25. The third arm 26 has a front part 33 having a fourth pivotal axis L4 parallel to the first pivotal axis L1 and perpendicular to the reference line 19. The hand units 27 support a wafer 21 thereon. The hand units 27 are end effectors attached to the extremity of the robot arm. Each of the hand units 27 has a holding part 34 for holding the wafer 21, and a connecting part 35 connected to the third arm 26. The two hand units 27 are disposed in a vertical arrangement.

The holding part 34 is formed in a Y-shape. The holding part 34 comes into contact with at least three parts of the wafer 21 at different circumferential positions from below the wafer 21 to support the wafer 21 in a horizontal position. The connecting part 35 has an elongate shape. The connecting part 35 has a base part 36 connected to the front part 33 of the third arm 26, and a front part 37 connected to the holding parts 34. The hand units 27 turn about the fourth pivotal axis L4 relative to the third arm 26.

The arms 24, 25 and 26 have substantially equal lengths, respectively. More concretely, a second distance R2 between the second pivotal axis L2 and the third pivotal axis L3 is equal to a third distance R3 between the third pivotal axis L3 and the fourth pivotal axis L4. A first distance R1 between the first pivotal axis L1 and the second pivotal axis L2 is substantially equal to the second distance R2 and the third distance R3, i.e., R1≈R2=R3. In this embodiment, R1=200 mm and R2=R3=208 mm.

The holding part 34 of each hand unit 27 is provided with a plurality of contact members. The contact members are pressed against the circumference of the wafer 21 mounted on the holding part 34 to hold the wafer 21. At least one of the contact members is a movable contact member movable in directions parallel to a radius of the wafer 21 mounted on the holding part 34. Preferably, the movable contact member moves along the reference line 19 to hold the wafer 21 by pressing the wafer 21 from the opposite sides of the reference line 19. Thus the wafer 21 is prevented from falling off the hand unit 27 even if the hand unit 27 moves along the reference line 19 and an inertial force acts on the wafer 21 in a direction X parallel to the reference line 19. Therefore, the wafer 21 can be moved at a high moving speed.

Referring to FIGS. 2 and 3, the arms 24, 25 and 26 and the hand units 27 are combined so that the arms 24, 25 and 26 and the hand units 27 are able to turn without interfering with each other. The first arm 24 is connected to an upper end part of the base unit 23, the back part 30 of the second arm 25 is placed on and connected to the front part 29 of the first arm 24, and the back part 32 of the third arm 26 is placed on and connected to the front part 31 of the second arm 25. The hand units 27 are placed on and connected to the front part 33 of the third arm 26.

Figure 4:
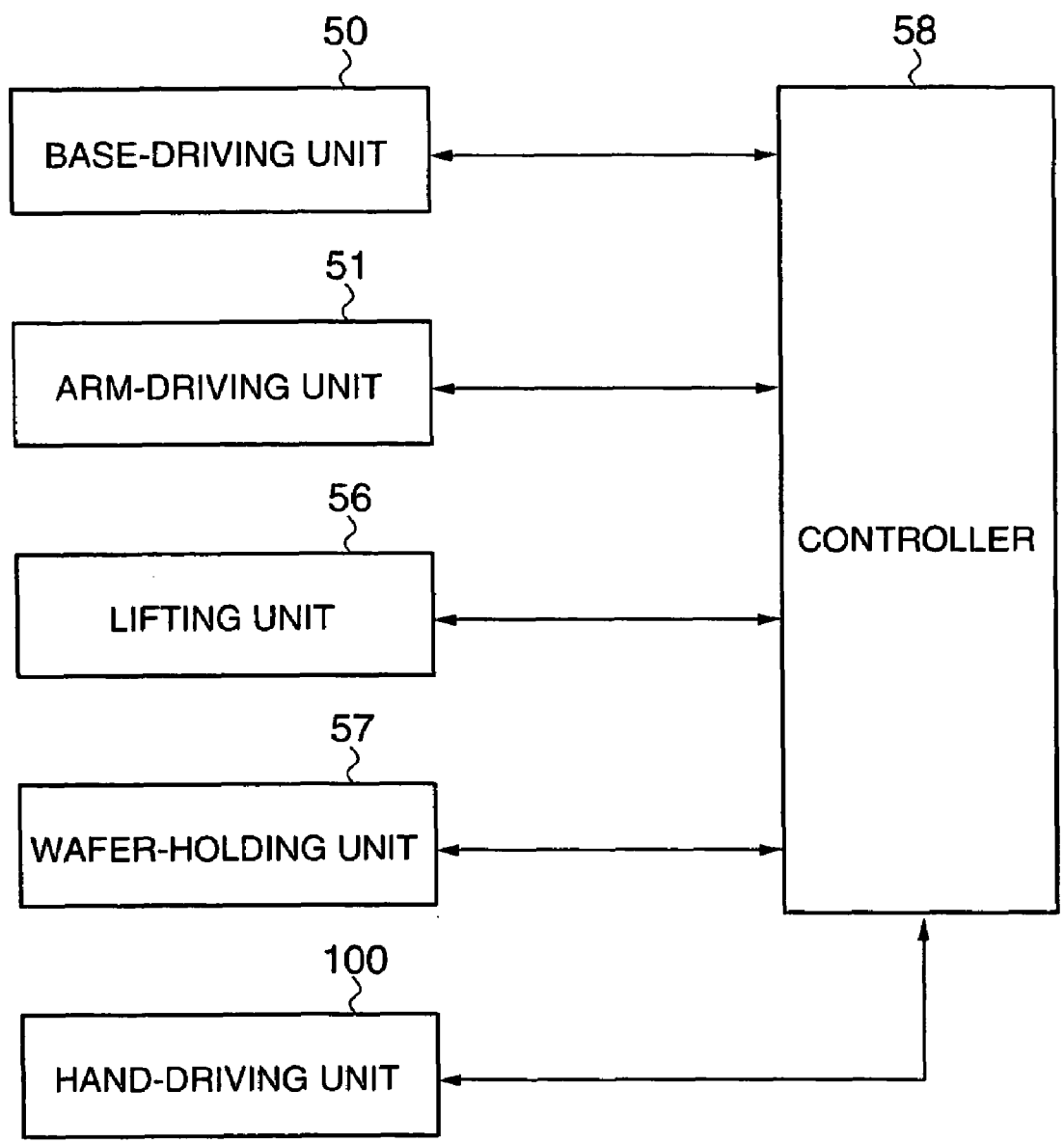
FIG. 4 is a block diagram of an electric system included in the articulated robot shown in FIG. 1.

Referring to FIG. 4 showing an electric system included in the articulated robot 20 in a block diagram, the electric system of the articulated robot 20 includes a base-driving unit 50, an arm-driving unit 51, a lifting unit 56, a wafer-holding unit 57, a hand-driving unit 100 and a controller 58. The base-driving unit 50 and the hand-driving unit 100 are provided, respectively, with rotary motors capable of moving at a predetermined angular step, such as servomotors provided with an encoder.

The base-drive unit 50 drives the base unit 23 for turning about the first pivotal axis L1 relative to the base 22; that is, the base-drive unit 50 turns the first arm 24 about the first pivotal axis L1 relative to the base 22. Preferably, the base-driving unit 50 is capable of turning the base unit 23 in opposite circumferential directions. In this embodiment, the base-driving unit 50 is disposed in a space in the base 22.

The arm-driving unit 51 drives the second arm 25 for turning about the second pivotal axis L2 relative to the first arm 24. Preferably, the arm-driving unit 51 is capable of turning the second arm 25 in opposite circumferential directions. In this embodiment, the arm-driving unit 51 is disposed in a space in the base 22.

The hand-driving unit 100 drives the hand units 27 for turning about the fourth pivotal axis L4 relative to the third arm 26. Preferably, the hand-driving unit 100 is capable of turning the hands 27 in opposite circumferential directions. In this embodiment, the hand-driving unit 100 is disposed in a space in the third arm 26. The hand-driving unit 100 is an end effector driving means for turning the hand units 27, namely, end effectors. The articulated robot 20 is provided with an interlocking mechanism 54 for turning the third arm 26 as the second arm 25 is turned. When the second arm 25 is turned about the second pivotal axis L2 through an angle, the interlocking mechanism 54 turns the third arm 26 about the third pivotal axis L3 relative to the second arm 25 through an angle proportional to the angle through which the second arm 25 is turned.

Referring to FIG. 3, the base unit 23 is vertically movable along the first pivotal axis L1 relative to the base 22. The lifting unit 56 of the articulated robot 20 drives the base unit 23 for vertical movement along the first pivotal axis L1. The arms 24, 25 and 26 and the hands 27 can be simultaneously vertically moved by vertically moving the base unit 23.

The articulated robot 20 moves the holding units 27 upward from below a wafer holding position to mount the wafer 21 on the hand units 27. The articulated robot 20 moves the holding units 27 holding the wafer 21 downward to locate the wafer 21 at a mounting position.

The lifting unit 56 is, for example, a ball screw mechanism provided with a servomotor. The ball screw mechanism includes a vertical threaded rod supported for rotation about its axis, a servomotor for rotationally driving the threaded rod, and a threaded member linked to the threaded rod and fixed to the base unit 23. The servomotor rotates the threaded rod to move the base unit 23 vertically. The lifting unit 56 may be any suitable mechanism other than the ball screw mechanism.

The wafer-holding unit 57 operates the hand units 27 to hold the wafer 21 with the hand units 27. The wafer-holding unit 57 moves at least one of the contact members of each hand unit 27 in a direction parallel to a radius of the wafer 21. For example, the wafer-holding unit 57 includes a pneumatic cylinder actuator. The pneumatic cylinder actuator is provided with a piston rod having a free end connected to the movable contact member. The pneumatic cylinder actuator is driven by compressed air supplied from the base 22 to move the movable contact member in a direction parallel to a radius of the wafer 21. The movable contact member presses the wafer 21 radially to hold the wafer 21 in cooperation with the other contact members. The movable contact member is moved radially outward to release the wafer 21.

The controller 58 of the articulated robot 20 controls the base-driving unit 50, the arm-driving unit 51, the lifting unit 56, the hand-driving unit 100 and the wafer-holding unit 57 to hold the wafer 21 at a predetermined wafer-feed position and to carry the wafer 21 to a predetermined wafer-delivery position. The controller 58 is capable of controlling the base-driving unit 50, the arm-driving unit 51, the hand-driving unit 100 and the lifting unit 56 to move the hand units 27 to a desired position defined by cylindrical coordinates in a three-dimensional space defined by a cylindrical coordinate system having its axis aligned with the first pivotal axis L1.

The controller 58 receives signals representing the angular positions and provided by encoders incorporated into the servomotors included in the base-driving unit 50, the arm-driving unit 51, the hand-driving unit 100 and the lifting unit 56 and controls the base-driving unit 50, the arm-driving unit 51, the hand-driving unit 100 and the lifting unit 56 in a feedback control mode to locate the wafer 21 accurately at a desired position.

The controller 58 moves the hand units 27 to the wafer-feeding position. Then, the controller 58 drives the wafer-holding unit 57 to hold the wafer 21 with the hand units 27. Then, the controller 58 moves the hand units 27 holding the wafer 21 to the wafer-delivery position and operates the hand units 27 to release the wafer 21. The articulated robot 20 thus carries the wafer 21 from the wafer-feeding position to the wafer-delivery position.

The controller 58 is, for example, a computer. The controller 58 is provided with a storage device storing an operation program defining steps of a predetermined carrying operation, and an arithmetic unit that executes the operation program read from the storage device and controls the base-driving unit 50, the arm-driving unit 51, the lifting unit 56, the hand-driving unit 100 and the wafer-holding unit 57 on the basis of information provided by the encoders. The operation program is written to the storage device by operating an input device.

Figure 5:
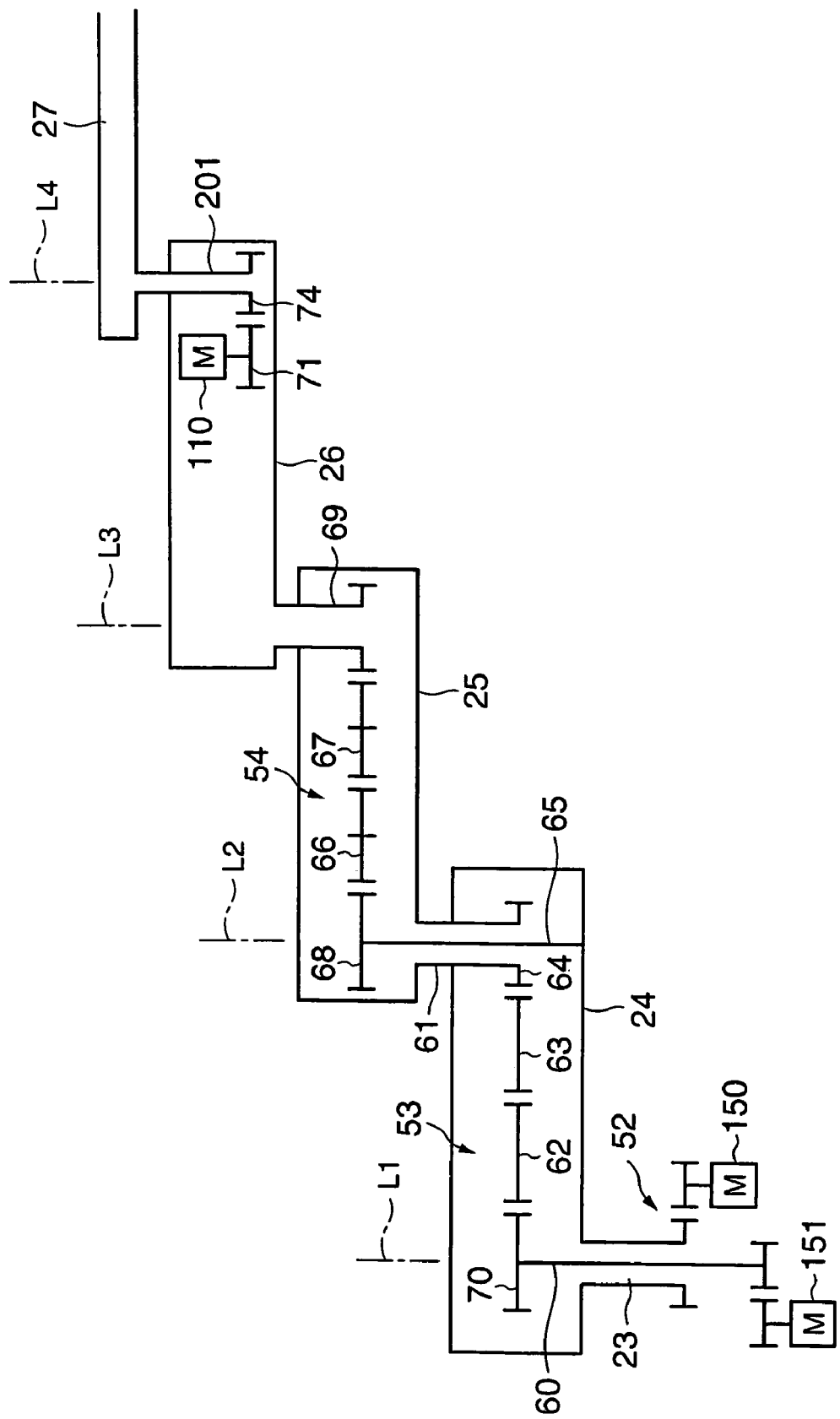
FIG. 5 is a schematic sectional view of assistance in explaining a power transmitting mechanism included in the articulated robot shown in FIG. 1.

Referring to FIG. 5 showing the articulated robot 20 in a schematic sectional view, the articulated robot 20 has a first servomotor 150 and a second servomotor 151 installed in the base 22. The articulated robot 20 has a first power transmission mechanism 52 for transmitting the power of the first servomotor 150 to the base unit 23, and a second power transmission mechanism 53 for transmitting the power of the second servomotor 151 to the second arm 25.

The first power transmission mechanism 52 includes a gear mechanism for transmitting the power of the first servomotor 150 to the base unit 23. The first power transmission mechanism 52 includes a reduction gear, not shown. The first servomotor 150 rotationally drives the input member of the reduction gear. The reduction gear amplifies an input torque at a predetermined amplification ratio to provide a large output torque, and reduces an input rotating speed at a predetermined reduction ratio to a lower output rotating speed. The output power of the reduction gear is transmitted through the gear mechanism of the first power transmission mechanism 52 to the base unit 23 to turn the base unit 23 together with the first arm 24 about the first pivotal axis L1.

The second power transmission mechanism 53 includes a gear mechanism for transmitting the power of the second servomotor 151 to the second arm 25. The second power transmission mechanism 53 includes a reduction gear, not shown. The second servomotor 151 rotationally drives the input member of the reduction gear. The reduction gear amplifies an input torque at a predetermined amplification ratio to provide a large output torque, and reduces an input rotating speed to a reduced output rotating speed. The output power of the reduction gear is transmitted through the gear mechanism of the second power transmission mechanism 53 to the second arm 25 to turn the second arm 25 about the second pivotal axis L2.

The second power transmission mechanism 53 for transmitting the power of the second servomotor 151 includes a hollow first drive shaft 60 having an axial hole, a hollow first driven shaft 61 having an axial hole, and a first gear train including a first gear 62, a second gear 63 and a third gear 64, which are meshed. The first drive shaft 60 is extended inside the base unit 23 coaxially with the first pivotal shaft L1 so as to rotate about the first pivotal axis L1 relative to the base unit 23. An internal space in the base 22 communicates with an internal space in the first arm 24 by means of the axial hole of the first drive shaft 60. The first drive shaft 60 has a lower end part placed inside the base 22, and an upper end part placed in the first arm 24. A gear 70 is mounted on the upper end part of the first drive shaft 60. The input end of the first drive shaft 60 is interlocked with the output shaft of the reduction gear. The gear 70 is engaged with the first gear 62. The gear 70 is detachably mounted on the first drive shaft 60.

The meshed gears 62, 63 and 64 of the first gear train are arranged in the internal space in the first arm 24 and are supported on the first arm 24. The gears 62, 63 and 64 are arranged in that order from one end, on the side of the base unit 23, of the first arm 24 toward the other end, on the side of the second arm 25, of the first arm 24. Power is transmitted from the first gear 62 through the second gear 63 to the third gear 64.

The first driven shaft 61 is disposed coaxially with the second pivotal axis L2 in the internal space in the first arm 24. The first driven shaft 61 rotates about the second pivotal axis L2 relative to the first arm 24. The first driven shaft 61 has a lower end part on which the third gear 64 is mounted, and an upper end part fixedly connected to the second arm 25. The first driven shaft 61 is detachably supported on the second arm 25.

The power of the second servomotor 151 is transmitted through the reduction gear to the first drive shaft 60. The first drive shaft 60 rotates about the first pivotal axis L1 relative to the base unit 23 to transmit power to the first gear 62. The rotational force of the first drive shaft 60 is transmitted through the first gear train including the gears 62, 63 and 64 supported on the first arm 24 to the first driven shaft 61. The first driven shaft 61 is rotated about the second pivotal axis L2 to turn the second arm 25 about the second pivotal axis L2 relative to the first arm 24. The reduction gear for transmitting the power of the second servomotor 151 to the second arm 25 may be omitted.

The interlocking mechanism 54 includes a gear mechanism for transmitting power to the third arm 26 to turn the third arm 26 as the second arm 25 is turned. The interlocking mechanism 54 includes a second drive shaft 65, a second gear train including a first gear 66 and a second gear 67, and a second driven shaft 69.

The internal space in the first arm 24 communicates with the internal space in the second arm 25 by means of the axial hole of the first driven shaft 61. The second drive shaft 65 is extended in the axial hole of the first driven shaft 61 coaxially with the second pivotal axis L2. The second drive shaft 65 has a lower end part fixed to the first arm 24 and an upper end part extended in the internal space in the second arm 25 and connected to a gear 68. The gear 68 is detachably mounted on the second drive shaft 65.

The meshed gears 66 and 67 of the second gear train are arranged in the second arm 25 and are supported for rotation on the second arm 25 to transmit power. The gear 66 is on the side of the base part of the second arm 25 and the gear 67 is on the side of the front part of the second arm 25.

The second driven shaft 69 is extended coaxially with the third pivotal axis L3 in the internal space in the second arm 25. The second driven shaft 69 is rotated about the third pivotal axis L3 relative to the second arm 25. The second driven shaft 69 has a lower end part connected to the second gear 67 and an upper end part fixedly connected to the third arm 26. The internal space in the second arm 25 communicates with that of the third arm 26 by means of the axial hole of the second driven shaft 69.

When the second arm 25 is turned relative to the first arm 24, the rotational force of the second drive shaft 65 is transmitted through the first gear 66 and the second gear 67 to the second driven shaft 69. Then, the driven shaft 69 is turned about the third pivotal axis L3 to turn the third arm 26 about the third pivotal axis L3 relative to the second arm 25.

A third servomotor 110 and a third gear train including gears 71 and 74 are arranged in the internal space in the third arm 26. The gear 71 is fixedly mounted on the output shaft of the third servomotor 110, and the gear 74 is meshed with the gear 71 and is fixedly mounted on a lower end part of a third driven shaft 201.

The third driven shaft 201 is extended coaxially with the fourth pivotal axis L4 in the internal space in the third arm 26. The internal space in the third arm 26 communicates with internal spaces in the hand units 27 by means of the axial hole of the third driven shaft 201. The third driven shaft 201 turns about the fourth pivotal axis L4 relative to the third arm 26. The third driven shaft 201 has a lower end part fixed to the gear 74 meshed with the gear 71 fixedly mounted on the output shaft of the third servomotor 110, and an upper end part fixedly connected to the hand units 27. The internal space in the third arm 26 communicates with the internal spaces in the hand units 27 by means of the axial hole of the third driven shaft 201.

When the output shaft of the third servomotor 110 is turned, the rotational force of the output shaft is transmitted through the gears 71 and 74 to the hand units 27 to turn the hand units 27 about the fourth pivotal axis L4 relative to the third arm 26.

When the second servomotor 151 is stopped and the first servomotor 150 is operated, the base unit 23 turns and the second arm 25 is turned together with the first arm 24 in the same direction as the base unit 23. Therefore, the second arm 25 can be turned about the first pivotal axis L1 with the angular position thereof kept unchanged by operating the second servomotor 151 to turn the second arm 25 such that an angular displacement of the second arm 25 due to the turning of the first arm 24 is cancelled out. Thus, the first servomotor 150 constitutes the base-driving unit 50, and the first servomotor 150 and the second servomotor 151 constitute the arm-driving unit 51. The third servomotor 110 constitutes the hand-driving unit 100. The interlocking mechanism 54 interlocks the second arm 25 and the third arm 26 so as to operate simultaneously without requiring any additional servomotor for driving the third arm 26.

In the interlocking mechanism 54, the gear ratio of the gear train including the gear 68 mounted on the second drive shaft 65, the gears 66 and 67 arranged in the second arm 25 and the gear mounted on the second driven shaft 69 is set such that the third arm 26 turns about the third pivotal axis L3 in one of opposite circumferential directions relative to the second arm 25 through an angle twice as large as an angle through which the second arm 25 turns in the other circumferential direction about the second pivotal axis L2 relative to the first arm 24. Suppose that the second arm 25 turns about the second pivotal axis L2 in one of opposite circumferential directions relative to the first arm 24 through an angle θ1, and the third arm 26 turns about the third pivotal axis L3 relative to the second arm 25 in the other circumferential direction through an angle θ2. Then, the gear ratio of the gear train of the interlocking mechanism 54 is adjusted such that θ2=2×θ1. If the hand units 27 are turned about the fourth pivotal axis L4 in the same direction as the first arm 24 through an angle θ3=θ1, the angular position of the hand units 27 with respect to the first arm 24 can be kept unchanged.

Thus, the front part 33 of the third arm 26 can be moved straight along the reference line 19 relative to the base unit 23 by turning the second arm 25. The front part 33 of the third arm 26 is turned about the first pivotal axis L1 by turning the base unit 23 about the first pivotal axis L1. Thus the articulated robot serves as a horizontal articulated robot capable of moving the hand units 27 in a horizontal plane perpendicular to the first pivotal axis L1 in a space defined by a cylindrical coordinate system. The angular position of the hand units 27 can be changed by turning the hand units 27 about the fourth pivotal axis L4 relative to the third arm 26 by the hand-driving unit 100. The hand units 27 can be moved vertically by the lifting unit 56. Thus, the hand units 27 can be optionally moved to a desired position in a three-dimensional space. As obvious from FIG. 5, the first arm 24, the second arm 25 and the third arm 26 can be turned about the first pivotal axis L1 without changing the angular positions of the second arm 25 and the third arm 26 with respect to the first arm 24 by operating both the first servomotor 151 and the second servomotor 150.

The articulated robot capable of changing the angular position of the hand units 27 and of moving the hand units 27 along the reference line 19 is suitable for use as an articulated robot provided with an end effector, such as a carrying robot or a painting robot.

Figure 6:
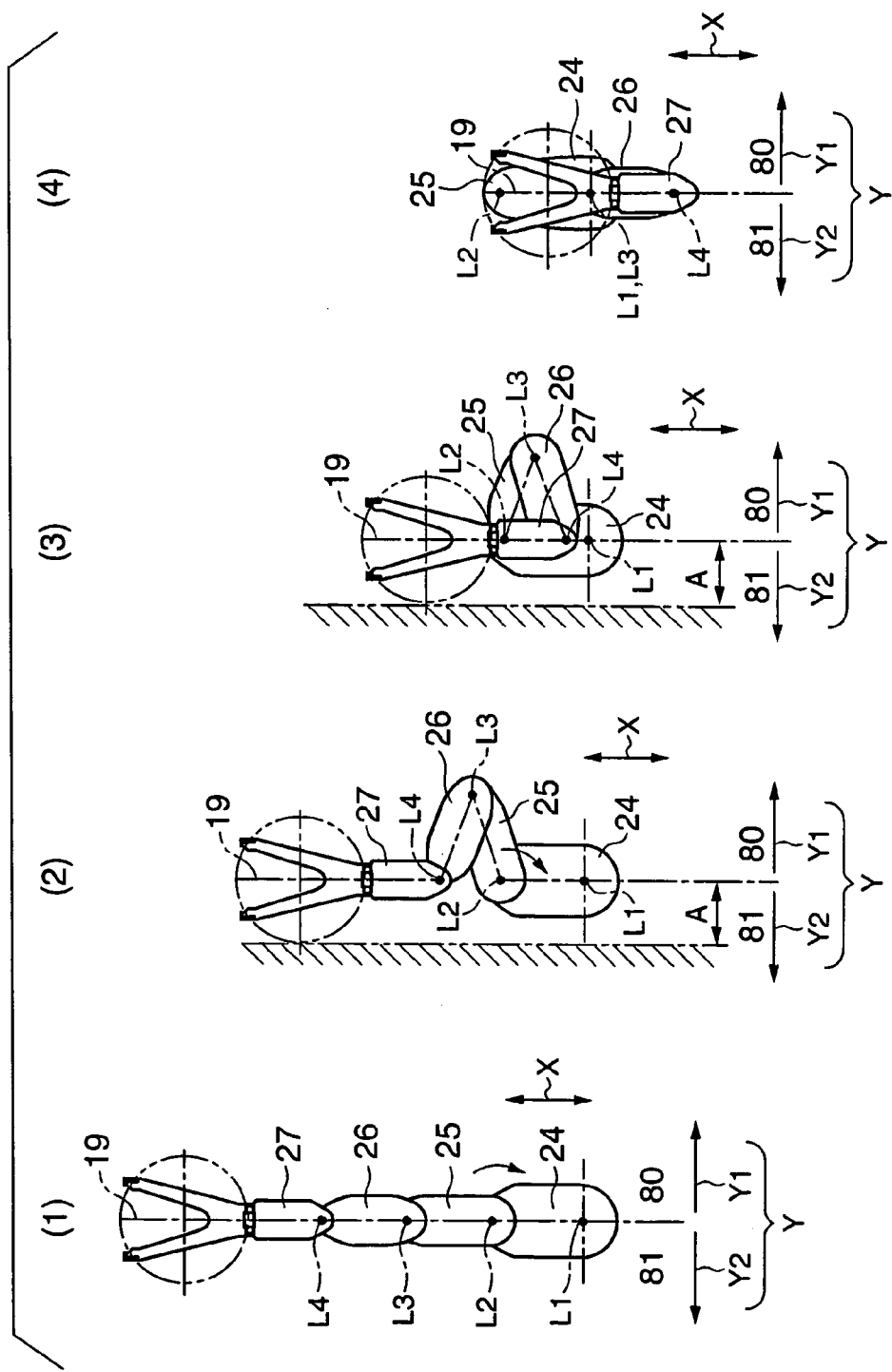
FIG. 6 is a plan view of assistance in explaining an operating mode of the articulated robot shown in FIG. 1.

FIG. 6 is a plan view of assistance in explaining an operation of the articulated robot 20. FIG. 6 shows steps of an operation for moving the hand units 27 from a position at the longest distance from the base 22 to a position at the shortest distance from the base 22 by turning the second arm 25 about the second pivotal axis L2 in one of opposite circumferential directions in a state where the arms 24, 25 and 26 are extended in a line along the reference line 19.

In FIG. 6(1), the arms 24, 25 and 26 and the hand units 27 are extended in alignment with the reference line 19, and the hand units 27 are at the longest distance from the first pivotal axis L1. In this state, the reference line 19 intersects the pivotal axes L1, L2, L3 and L4 perpendicularly.

In this state, the arm-driving unit 51 turns the second arm 25 about the second pivotal axis L2 relative to the first arm 24 in one of opposite circumferential directions. Then, the interlocking mechanism 54 turns the third arm 26 in the other circumferential direction about the third pivotal axis L3 relative to the second arm 25 through an angle twice as large as an angle through which the second arm 25 is turned. The hand-driving unit 100 turns the hand units 27 about the fourth pivotal axis L4 in the same direction as the second arm 25 so that the angular position of the hand units 27 with respect to the first arm 24 may be kept unchanged.

Thus, the second arm 25, the third arm 26 and the hand units 27 can be turned as shown in FIGS. 6(1) to 6(4) such that the angular position of the hand units 27 with respect to the first arm 24 remains unchanged and the hand units 27 are moved straight in the first direction X parallel to the reference line 19. A second direction Y is perpendicular to the first direction and the first pivotal axis L1.

As shown in FIG. 6, a working space in which the articulated robot 20 operates is divided into a first working area 80 and a second working area 81 by an imaginary plane including the reference lone 19 and the first pivotal axis L1. In the operation shown in FIG. 6, the second arm 25 and the third arm 26 always move only in the first working area 80, and the hand units 27 are moved along the reference line 19. In this operation, the second arm 25 and the third arm 26 never move in the second working area 81. Even if obstacles lie in the second working area 81, the movement of the second arm 25 and the third arm 26 is not obstructed by the obstacles lying in the second working area 81 because the second arm 25 and the third arm 26 move only in the first working area 80. Thus the working area of the articulated robot 20 does not need to extend in the second direction Y2. An operating mode where the second arm 25 and the third arm 26 move in the first working area 80 is called a right-hand system.

Figure 7:
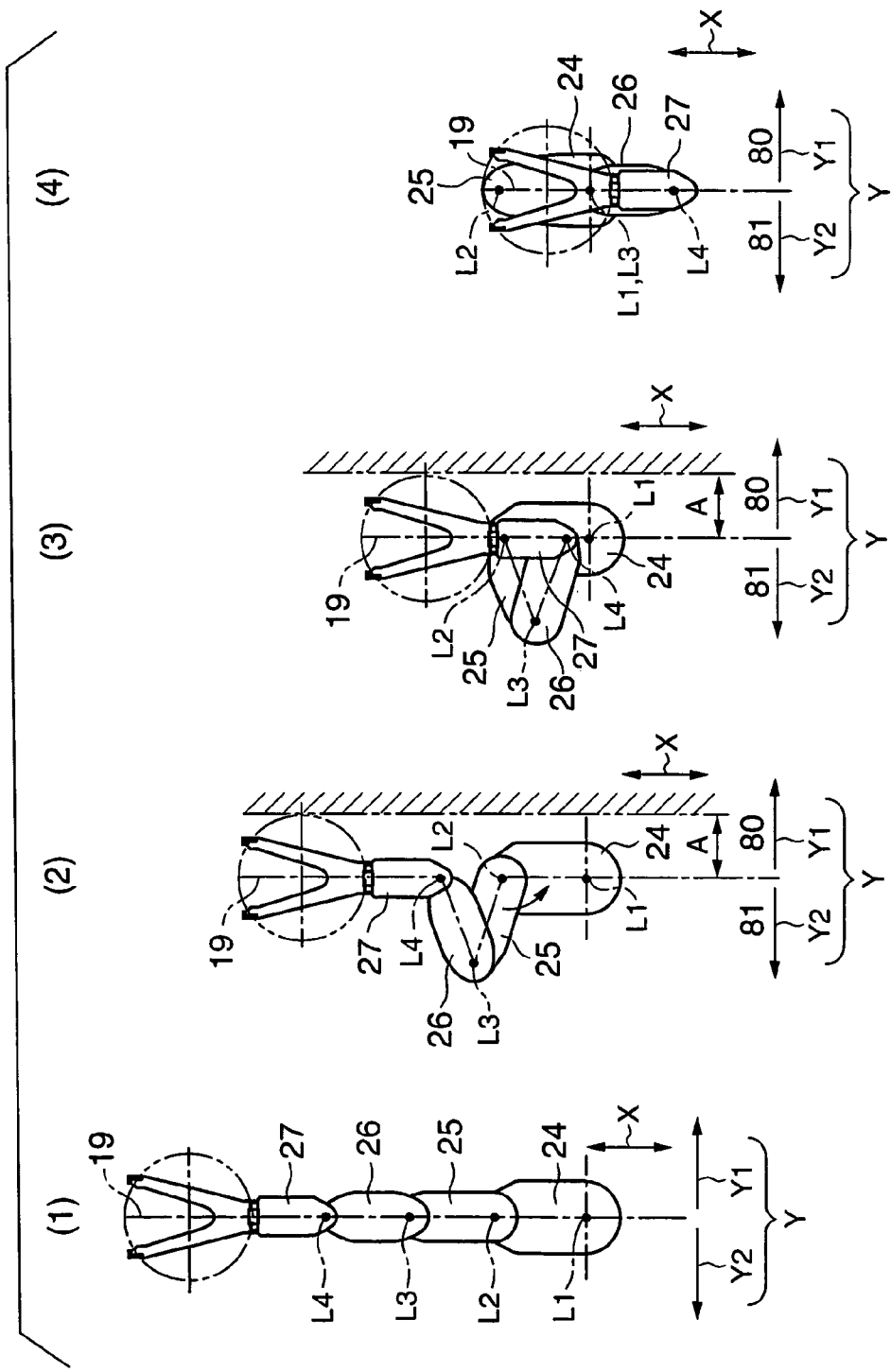
FIG. 7 is a plan view of assistance in explaining another operating mode of the articulated robot shown in FIG. 1.

FIG. 7 is a plan view of assistance in explaining another operating mode of the articulated robot 20. FIG. 7 shows steps of an operation for moving the hand units 27 from a position at the longest distance from the base 22 to a position at the shortest distance from the base 22 by turning the second arm 25 about the second pivotal axis L2 in the other circumferential direction in a state where the arms 24, 25 and 26 are extended in a line along the reference line 19. In a state shown in FIG. 7(1), the second arm 25 and the third arm 26 are turned in the second working area 81 opposite the first working area 80 with respect to the reference line 19. An operating mode where the second arm 25 and the third arm 26 move in the second working area 81 is called a left-hand system.

As obvious from FIGS. 6 and 7, the arms 24 to 26 can be operated only in either the first working region 80 or the second working area 81 by selectively determining a direction in which the second arm 25 is turned.

Figure 8:
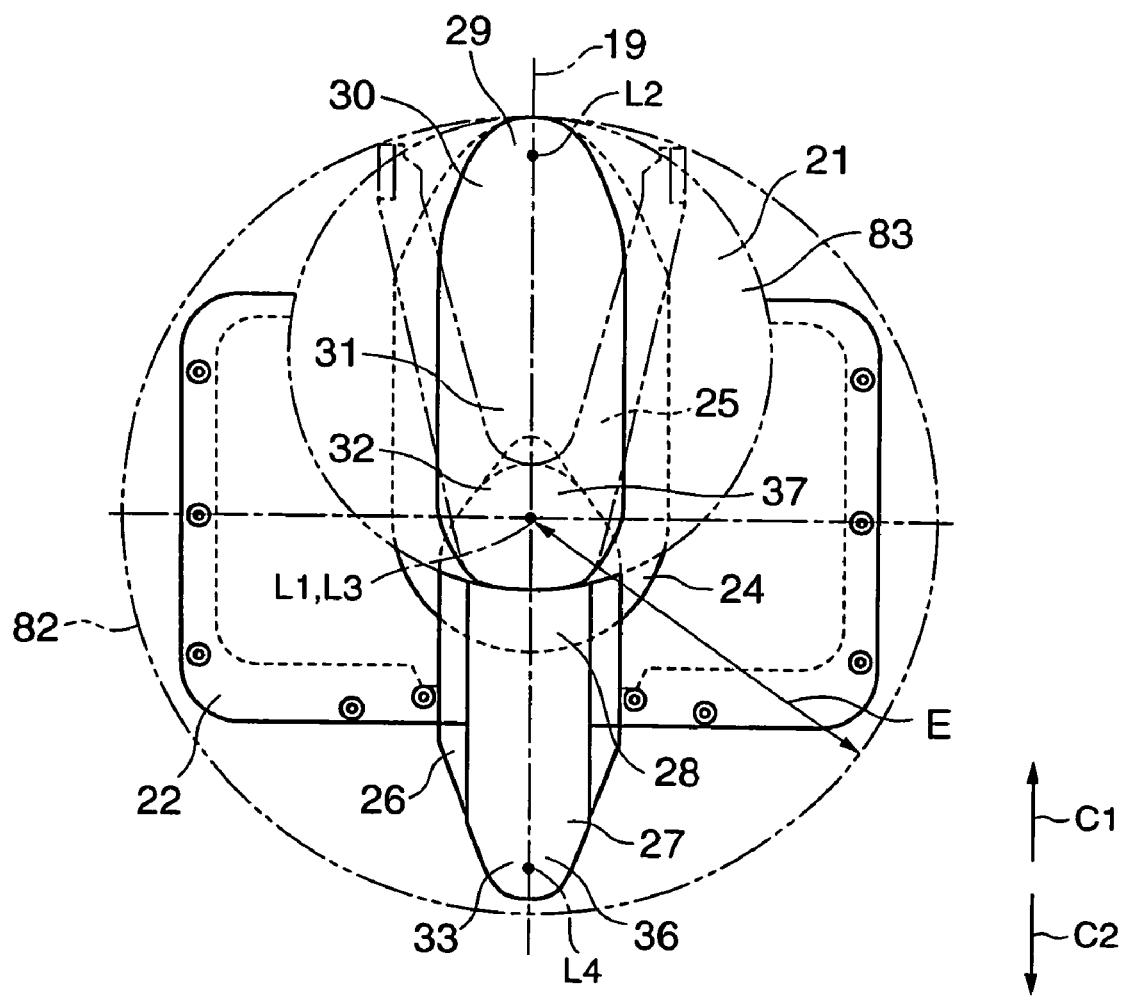
FIG. 8 is a plan view of the articulated robot shown in FIG. 1 in a state where first to third arms and robot hands of the articulated robot are set such that the radius of a circle in which the articulated robot is turned is a minimum.

FIG. 8 is a plan view of the articulated robot 20 in a state where the arms 24, 25 and 26, and the hand units 27 are folded to minimize the radius of a circle in which the articulated robot 20 turns. In a state where the radius of a circle in which the articulated robot 20 turns about the first pivotal axis L1 is a minimum, the arms 24, 25 and 26 and the hand units 27 are aligned with the reference line 19, the first arm 24 extends in a direction C1, i.e., a direction from the base part 28 toward the front part 29, and the second arm 25 and the third arm 26 extend in a direction C2, i.e., a direction from the base part 30 toward the front part 31 of the second arm 25 or a direction from the base part 36 toward the front part 37 of the third arm 26, opposite the direction C1. In this state, the arms 24, 25 and 26 are turned such that the pivotal axes L1 to L4 are arranged along the reference line 19, the third pivotal axis L3 and the first pivotal axis L1 coincide substantially with each other, and the second pivotal axis L2 and the fourth pivotal axis L4 are symmetrical with respect to the first pivotal axis L1. The respective lengths of the arms 24, 25 and 26 and the hand units 27 are determined such that, in an imaginary plane perpendicular to the first pivotal axis L1, a circular turning area 83 in which the hand units 27 holding the wafer 21 turn is included in a circular turning area 82 having its center on the first pivotal axis L1 and a radius corresponding to the distance E between the first pivotal axis L1 and the second pivotal axis L2.

When the arms 24, 25 and 26 and the hand units 27 are turned and set in a state shown in FIG. 8, the articulated robot 20 turns about the first pivotal axis L1 in the turning region 82.

Figure 9:
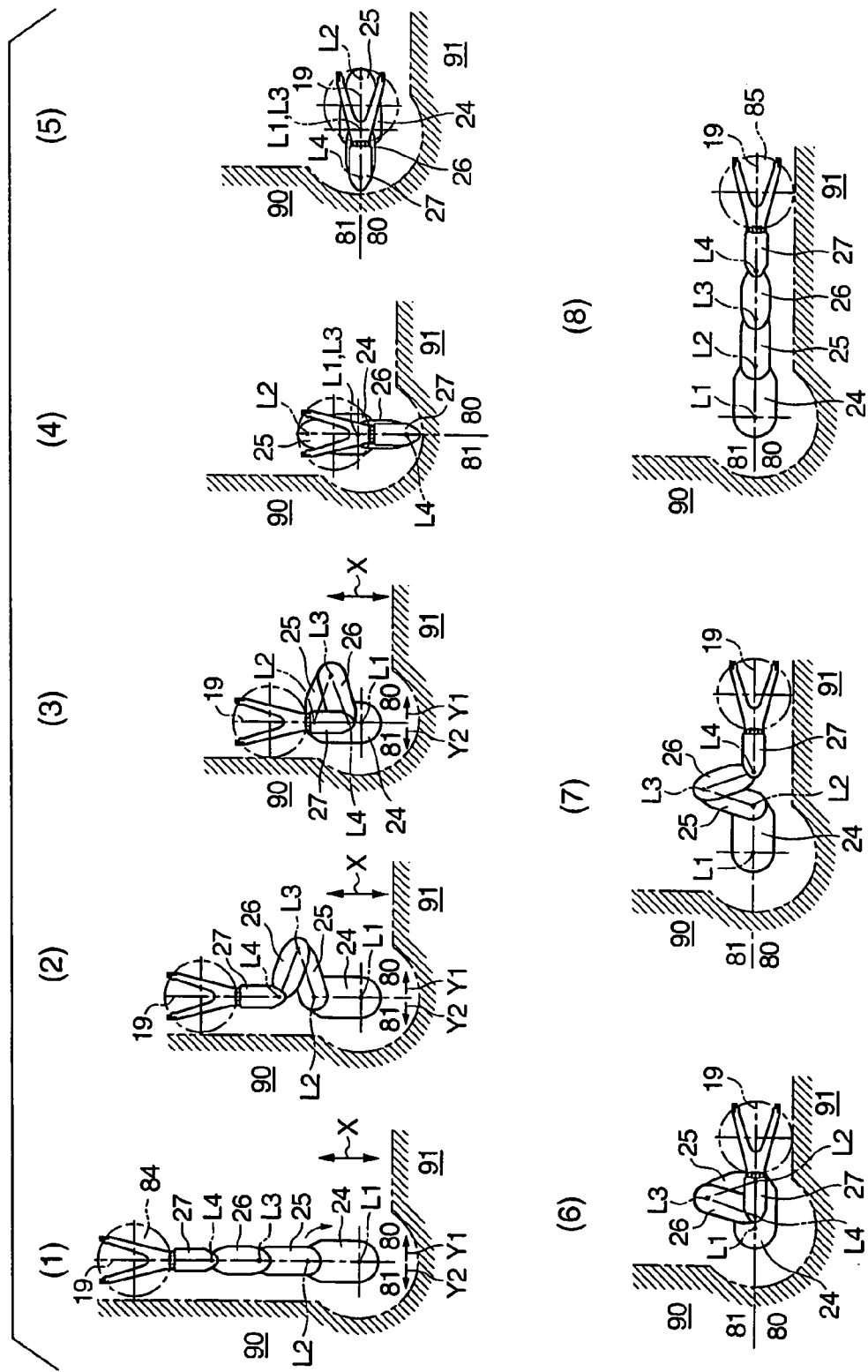
FIG. 9 is a plan view of assistance in explaining a third operating mode of the articulated robot shown in FIG. 1.

FIG. 9 is a plan view of assistance in explaining a third operating mode of the articulated robot 20. FIG. 9 shows a carrying operation for carrying the wafer 21 from a wafer-feed position 84 to a wafer-delivery position 85. The wafer-feed position 84 and the wafer-delivery position 85 are spaced apart by an angular interval of 90°.

The controller 58 controls the base-driving unit 50 to turn the base unit 23 so as to direct the first arm 24 toward the wafer-feed position 84. The arm-driving unit 51 drives the second arm 25 and the third arm 26 in the first working area 80 in the right-hand system to move the hand units 27 to the wafer-feed position 84. Upon the arrival of the hand units 27 at the wafer-feed position 84 as shown in FIG. 9(1), the wafer-holding unit 57 operates the hand units 27 to hold the wafer 21. After the wafer 21 has been held by the hand units 27, the controller 58 controls the arm-driving unit 51 to move the hand units 27 straight toward the base 22. As shown in FIGS. 9(1) to 9(3), the articulated robot 20 operates in the right-hand system to move the arms 24 to 26 in the first working area 80. Therefore, the second arm 25 and the third arm 26 never move in the second working area 81 on the left-hand side of the reference line 19 while hand units 27 holding the wafer 21 move toward the base 22.

Then, as shown in FIG. 9(4), the controller 58 turns the second arm 25 and the third arm 26 so as to decrease the radius of the turning circle to a minimum, and then the base-driving unit 50 turns the base unit 23 so as to direct the first arm 24 toward the wafer-delivery position 85 as shown in FIG. 9(5). Then, the controller 58 controls the arm-driving unit 51 to advance the hand units 27 straight to the wafer-delivery position 85. As shown in FIGS. 9(6) to 9(8), the arm-driving unit 51 drives the second arm 25 and the third arm 26 in the second working area 81 in the left-hand system to move the hand units 27 to the wafer-delivery position 8. Therefore, the second arm 25 and the third arm 26 never move in the first working area 80 on the right-hand side of the reference line 19 as shown in FIGS. 9(6) to 9(8) while hand units 27 holding the wafer 21 move toward the wafer-delivery position 85.

Thus the second arm 25 and the third arm 26 of the articulated robot 20 never move in a space 90 on the left-hand side of the base 22 represented by a shaded area in FIG. 9 and in a space 91 under the base 22. Thus the articulated robot 20 is capable of operating in a narrow working space.

Figure 17:
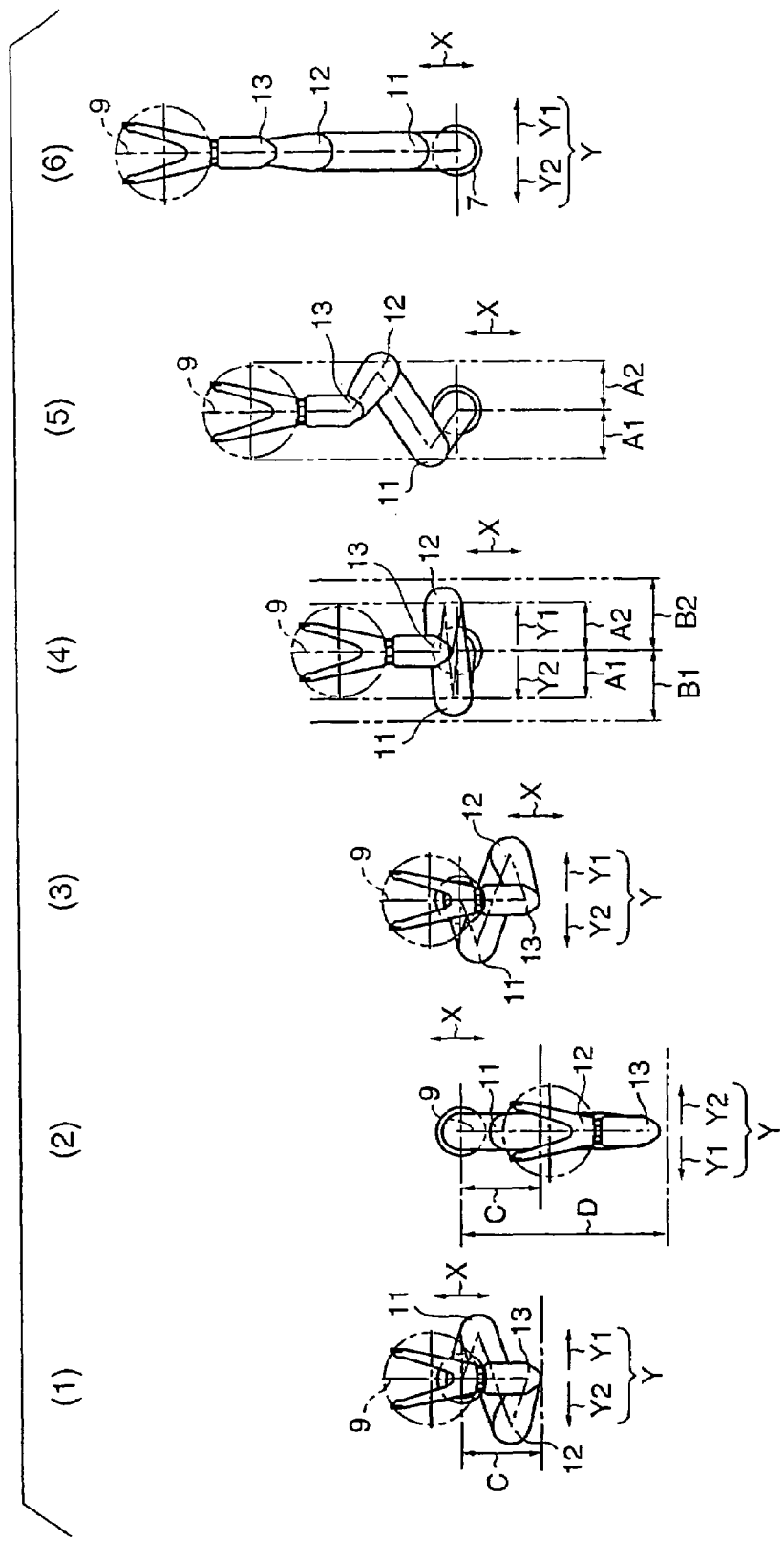
FIG. 17 is a plan view of an articulated robot in a second modification of the articulated robot shown in FIG. 15.

As shown in FIGS. 9(4) and 9(5), the radius of the turning circle is a minimum when the arms 24, 25 and 26 and the hand units 27 are aligned with the reference line 19 and the hand units 27 are at the shortest distance from the base 22. Therefore, the articulated robot 20 can be easily changed from the right-hand system to the left-hand system. The prior art articulated robot shown in FIG. 17 can be changed from the right-hand system to the left-hand system and vice versa only after the joint 13 of the third arm 5 and the hand unit 6 has been moved away from the base 7 in the first direction as shown in FIG. 7(2) so that the arms 3, 4 and 5 are aligned with the reference line 9, which requires an additional operation. In changing the articulated robot from the right-hand system to the left-hand system or from the left-hand system to the right-hand system, a space having a length D in the first direction X as shown in FIG. 17(2) is necessary; that is, an additional operating area is necessary on the opposite side of a desired position with respect to the base. Even if the articulated robot is changed from the right-hand system to the left-hand system, the second and the third arm line in both the first and the second working area. Thus the prior art articulated robot needs a large working space larger than that needed by the articulated robot 20 of the present invention. The articulated robot 20 of the present invention is can operate in a working space smaller than that needed for the operation of the prior art articulated robot 1, and can be changed from the right-hand system to the left-hand system in a short time in a narrow working area.

Since the articulated robot 20 of the present invention has the three arms 24, 25 and 26, the respective lengths of the arms 24, 25 and 26 are shorter than those of the two arms of an articulated robot for carrying the wafer 21 for the same distance and hence the articulated robot 20 can operate in a narrow working area. The articulated robot 20 can carry the wafer 21 for a distance longer than that for which the articulated robot provided with the two arms can carry the wafer 21 if the respective lengths of the three arms of the articulated robot 20 are equal to those of the two arms of the articulated robot provided with the two arms. The articulated robot 20 needs a small floor space and scarcely produces dust as compared with an articulated robot having a base 22 that moves along guide rails. Therefore, the articulated robot 20 of the present invention is suitable for carrying the semiconductor wafer 21.

Since the second arm 25 and the third arm 26 of the articulated robot 20 of the present invention are interlocked, any special driving means for driving the third arm 26 is not necessary. Consequently, the articulated robot 20 can be produced at a low production cost. Since the driving units are built in the base 22, the arm-driving unit 51 does not need to be incorporated in one of the arms 24, 25 and 26, and hence the arms 24, 25 and 26 can be formed in compact, lightweight structures.

In this embodiment, the power of the arm-driving unit 51 is transmitted by the gear trains to the second arm 24, the third arm 26 and the hand units 27. The power transmitting mechanism including the gear trains, as compared with a belt-drive power transmitting mechanism, is effective in enhancing the rigidity of the arms 24, 25 and 26. When the arms 24, 25 and 26 driven by a belt-drive power transmitting mechanism are moved rapidly or stopped suddenly, it is highly possible that the belts of the belt-type power transmitting mechanism are stretched and the turning arms 24, 25 and 26 shake. Consequently, the hand units cannot be accurately positioned. In some cases, the wafer 21 cannot be properly held. The gears of the gear trains of the power transmitting mechanism of the articulated robot 20 of the present invention are meshed with the least possible back lashes between the teeth thereof and hence the amplitude of the shaking of the arms is small as compared with that of the shaking of the arms operated by the belt-drive power transmitting mechanism. The adverse effect of the shaking of the arms is significant when the articulated robot is provided with three arms. The power transmitting mechanism including the gear trains reduces such an adverse effect of the shaking of the arms.

A piping harness for supplying compressed air to the pneumatic cylinder actuators of the hand units 27 are extended through the articulated robot 20. The piping harness is extended from the base 22 through the first drive shaft 60, the first arm 24, the first driven shaft 61, the second arm 25, the second driven shaft 69, the third arm 26 and the third driven shaft 201 to the pneumatic cylinder actuators. The arrangement of the piping harness in the arms 24, 25 and 26 further reduces the possibility of producing dust. In the articulated robot 20 thus constructed, allowance for the movement of the piping harness necessary to turn the second arm 25 is short as compared with that in the prior art articulated robot.

As shown in FIG. 8, the respective effective lengths of the arms 24, 25 and 26 and the hand units 27 are selectively determined such that the radius E of the turning circle having its center at the first pivotal axis L1 in which each of the arms 24, 25 and 26 turns is a minimum in a state where the arms 24, 25 and 26 are aligned with the reference line 19 such that the direction C1 from the base part 28 toward the front part 29 of the first arm 24 is opposite to the direction C2 from the base part 30 toward the front part 31 of the second arm 25 and from the base part 32 toward the front part 33 of the third arm 26. Therefore, even if the articulated robot 20 is changed from the right-hand system to the left-hand system while the hand units 27 are moved as shown in FIG. 9, the articulated robot 20 does not need a large working area as large as that needed by the prior art articulated robot. Consequently, any additional working area for changing the working area of the second arm 25 and the third arm 26 is not necessary and hence the working area of the articulated robot 20 is narrower than that needed by the prior art articulated robot. The articulated robot 20 of the present invention does not need any step of operation corresponding to the step of operation of the prior art articulated robot explained in connection with FIG. 17(2). Therefore, the articulated robot 20 is capable of quickly carrying the wafer 21 to the desired position.

As apparent from the foregoing description, the arms 24, 25 and 26 of the articulated robot 20 embodying the present invention operate in narrow working areas and hence a space for installing devices other than the articulated robot 20 can be increased when the articulated robot 20 is installed in a predetermined space in the housing together with those devices. The predetermined space in the housing may be small and hence the interior of the housing can be efficiently cleaned.

Figure 10:
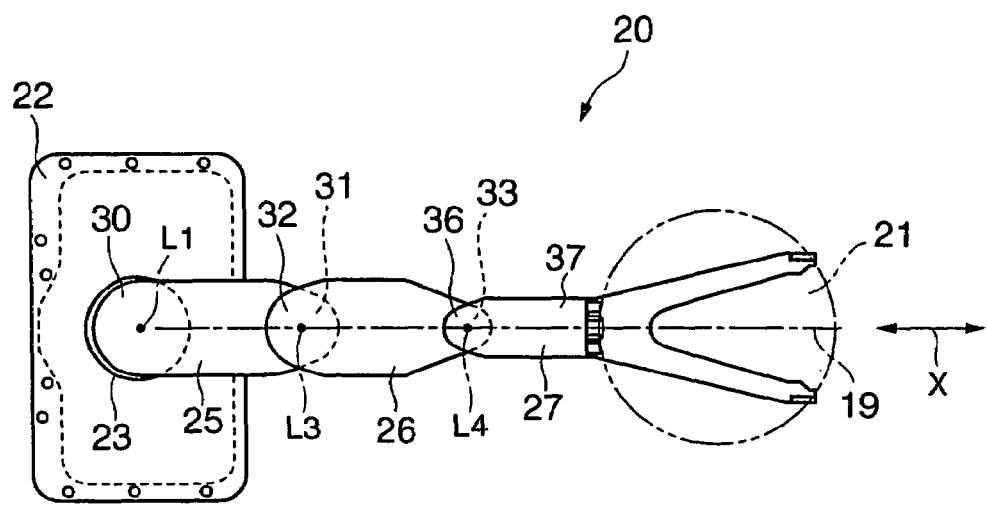
FIG. 10 is a plan view of the articulated robot shown in FIG. 1 in another mode of use.
Figure 11:
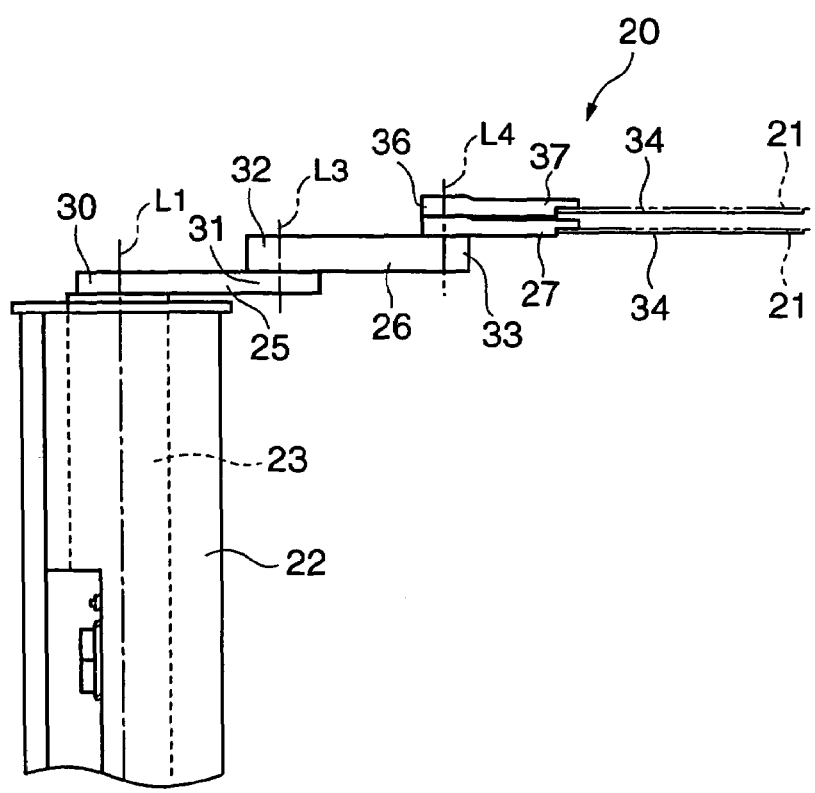
FIG. 11 is a side elevation of the articulated robot shown in FIG. 1 in the mode of use shown in FIG. 10.

FIGS. 10 and 11 are a plan view and a side elevation, respectively, of the articulated robot 20 in another mode of use. As shown in FIGS. 10 and 11, the first arm 24 can be disconnected from the base unit 23 and the second arm 25, and the second arm 25 can be connected to the base unit 23. Thus the articulated robot 20 can be converted into an articulated robot provided with the second arm 25 and the third arm 26 by removing the first arm 24. The second arm 25 is detachably connected to the base unit 23. More concretely, the base part 30 of the second arm 25 is connected to the base unit 23. The second arm connected to the base unit 23 can turn about the first pivotal axis L1 relative to the base 22. The third arm 26 is connected to the second arm 25, and the hand units 27 are connected to the third arm 26 in the same manner as that mentioned above. The base-driving unit 50 turns the base unit 23 together with the second arm 25 about the first pivotal axis L1 relative to the base 22. The arm-driving unit 51 drives the second arm 25 for turning about the first pivotal axis L1 relative to the base unit 23.

Figure 12:
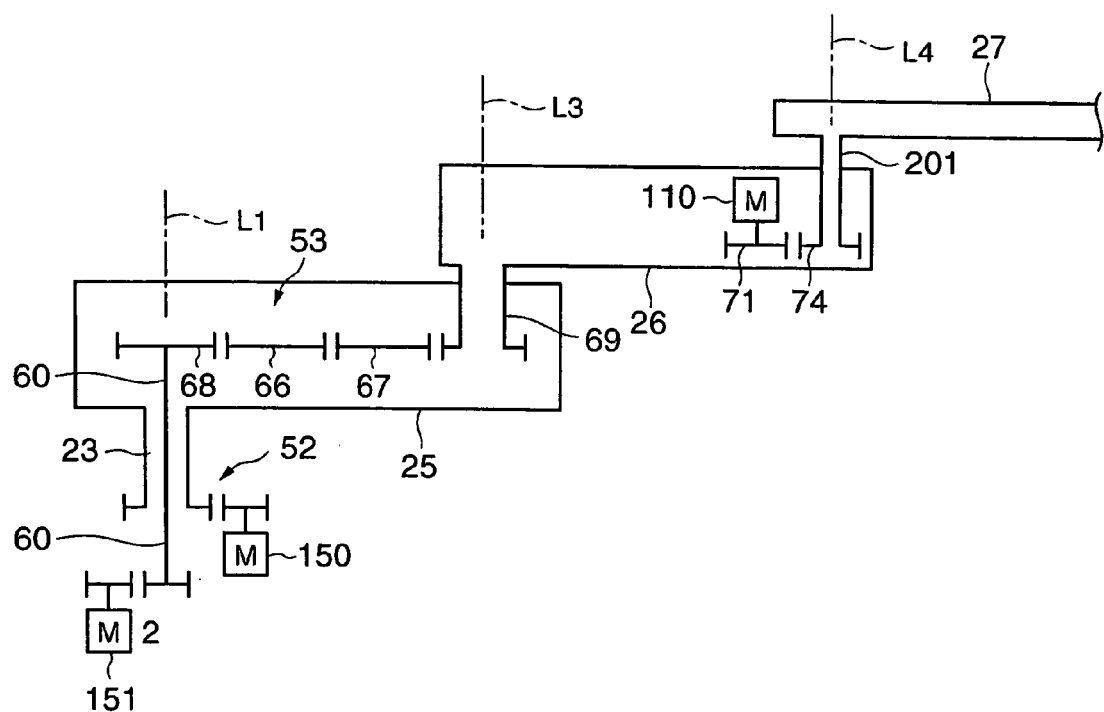
FIG. 12 is a schematic sectional view of assistance in explaining a power transmitting mechanism for the articulated robot shown in FIG. 1 in another mode of use.

FIG. 12 is a schematic sectional view of assistance in explaining a power transmitting mechanism for the articulated robot 20 in another mode of use. The articulated robot 20 shown in FIG. 12 differs from the articulated robot 20 shown in FIG. 5 in the connection of the second arm 25 and the base unit 23. The base part of the second arm 25 is connected fixedly to the base unit 23. The internal space in the base 22 communicates with the internal space in the second arm 25 by means of the axial hole of the first drive shaft 60. The gear 68 is mounted on the upper end of the first drive shaft 60 in the second arm 25. The second arm 25 is connected to the base unit 23 with the second pivotal axis L2 thereof aligned with the first pivotal axis L1. The first drive shaft 60 turns about the second pivotal axis L2.

When the second servomotor 151 turns the first drive shaft 60 about the first pivotal axis L1, a rotational force is transmitted from the first drive shaft 60 through the gears 68, 66 and 67 arranged in the second arm 25 to the second driven shaft 69. When the second driven shaft 69 is turned, the third arm 26 turns about the third pivotal axis L3 relative to the second arm 25.

Thus the third arm 26 is turned through an angle twice as large as an angle through which the second arm 25 is turned in a direction opposite a direction in which the second arm 25 is turned. Thus the articulated robot 20 provided with the three arms 24, 25 and 26 can be readily converted into the articulated robot 20 provided with the two arms 25 and 26 simply by removing the first arm 24 without changing the gears arranged in the arms 25 and 26, which improves the convenience of the articulated robot 20.

For example, an articulated robot provided with three arms and an articulated robot provided with two arms can be built of common component parts and hence the production cost of those articulated robots can be reduced. Since the number of the arms of the articulated robot 20 can be changed after installing the articulated robot 20, the articulated robot 20 does not need to be replaced with another one.

Figure 13:
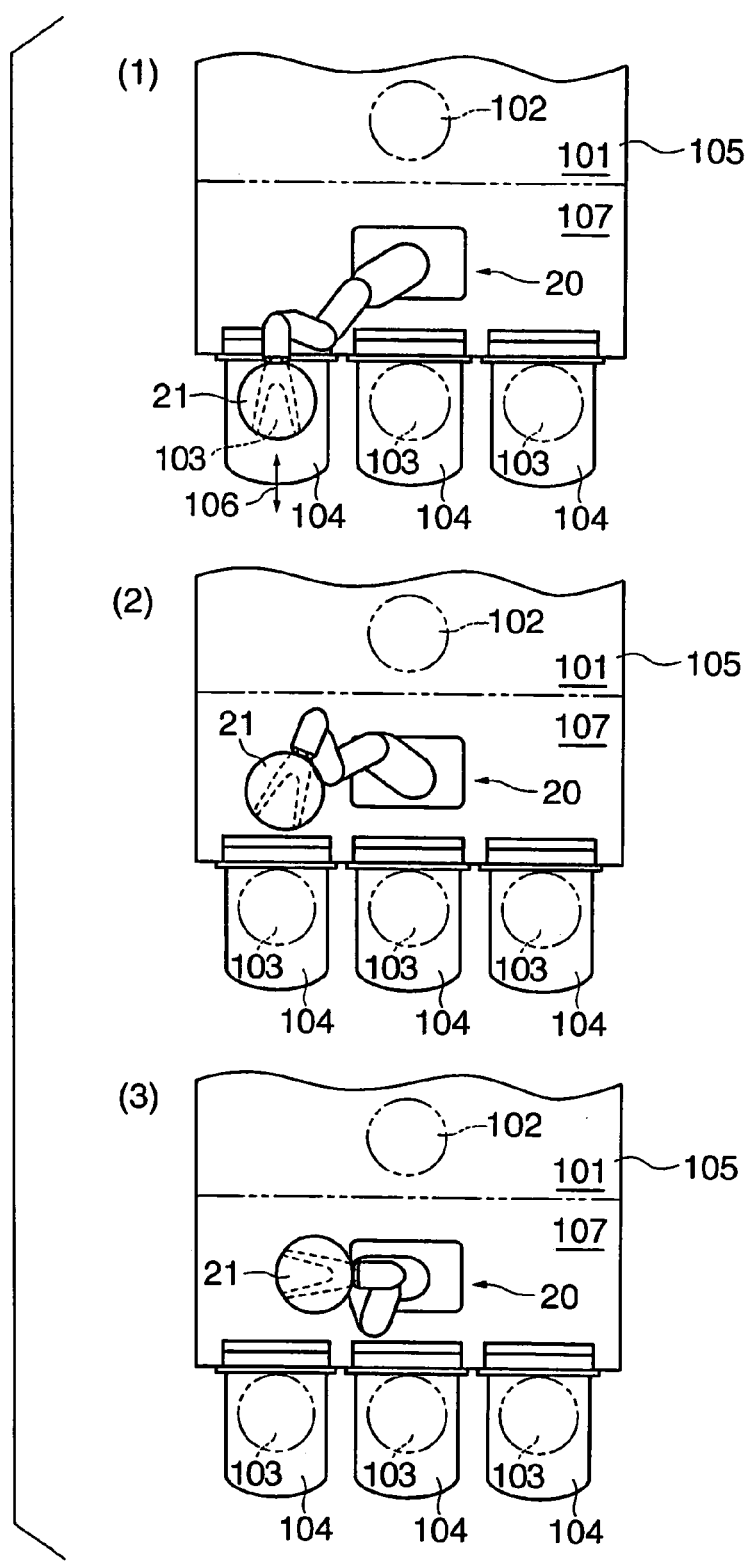
FIG. 13 is a plan view of the articulated robot shown in FIG. 1 of assistance in explaining a fourth operating mode of the articulated robot.
Figure 14:
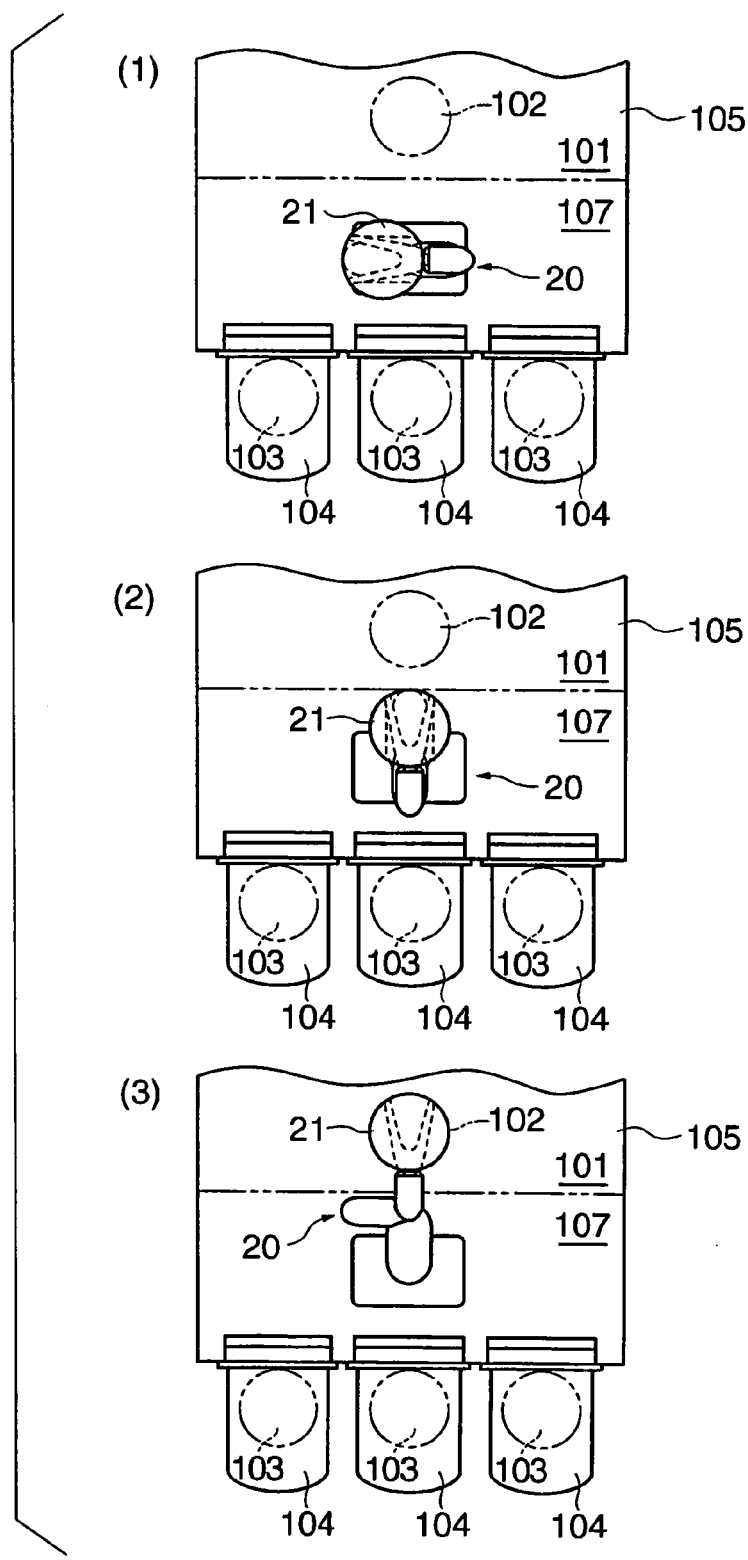
FIG. 14 is a plan view of assistance in explaining the fourth operating mode of the articulated robot shown in FIG. 1.
Figure 15:
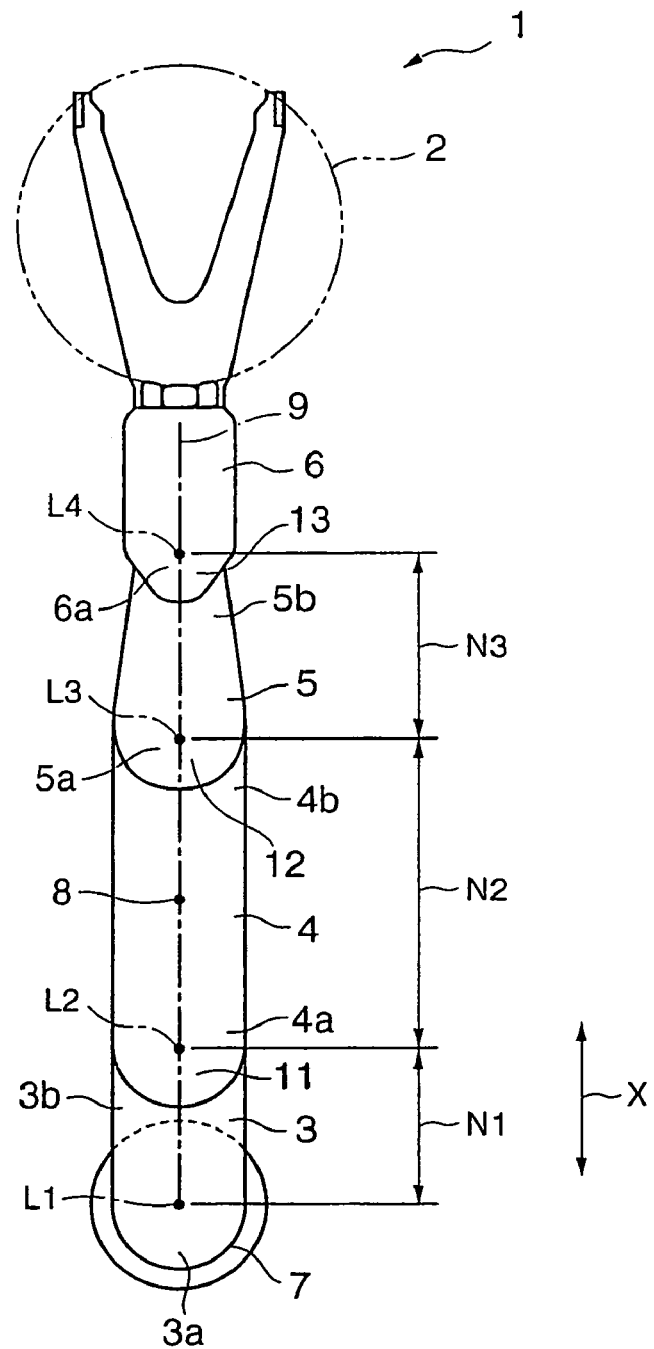
FIG. 15 is a plan view of a prior art articulated robot.
Figure 16:
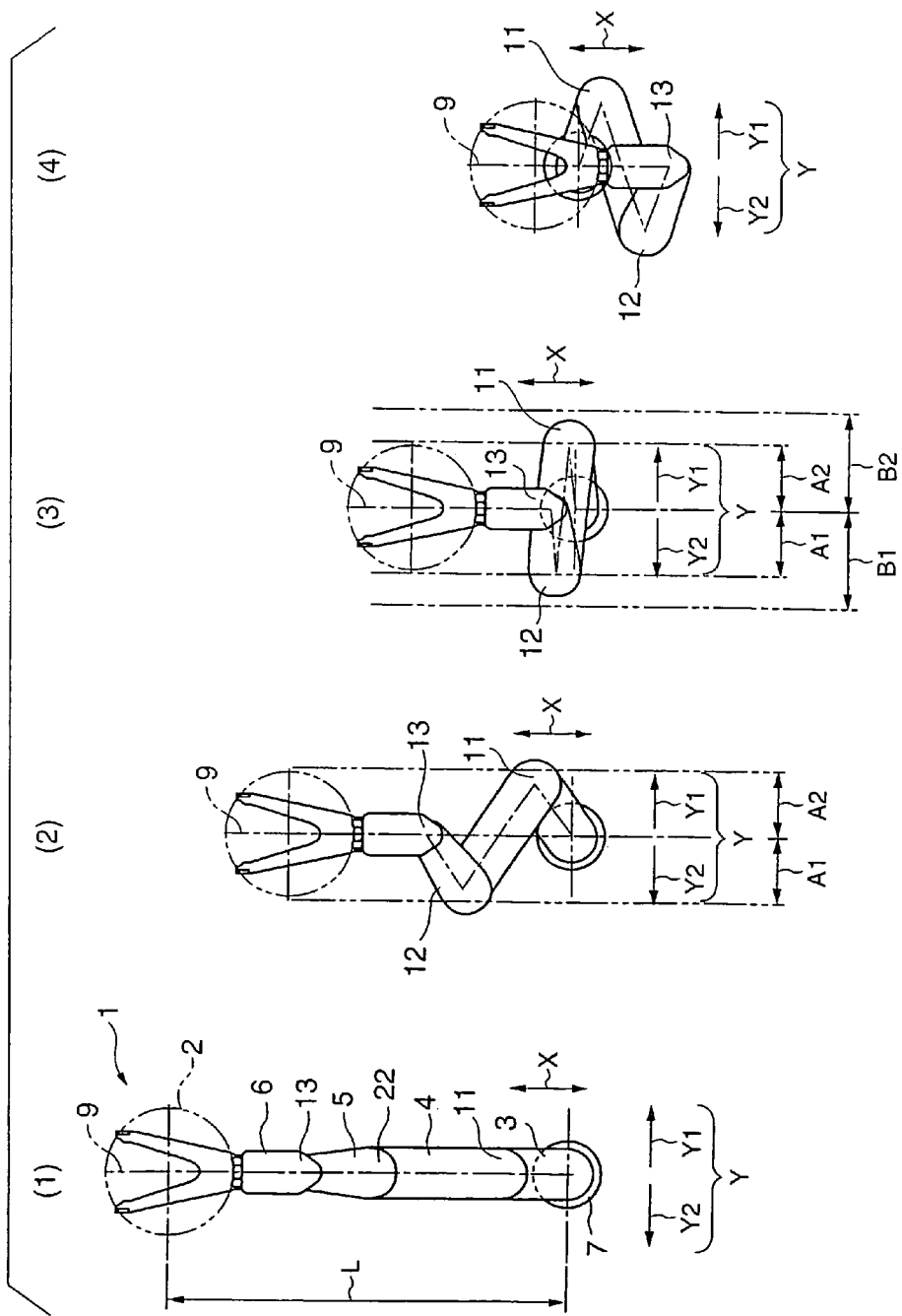
FIG. 16 is a plan view of an articulated robot in a first modification of the articulated robot shown in FIG. 15.

FIGS. 13 and 14 show the articulated robot 20 in a fourth operating mode. The articulated robot 20 is installed in a clean space 101 free from dust in a housing 105. The articulated robot 20 picks up a wafer 21 at a wafer transfer position 103 and carries the wafer 21 to a predetermined processing position 102. Then, the wafer 21 is processed by a process, such as an etching process, by a processing apparatus.

The articulated robot 20 picks up the processed wafer 21 at the processing position 102 and returns the processed wafer 21 to the wafer transfer position 103. The cassette is contained in a FOUP (Front Opening Unified Pod) 104. The FOUP 104 contains the cassette in an internal space that can be separated from and can be opened to an external space. The FOUP 104 with its internal space sealed is connected to a housing 105, and then the internal space of the FOUP 104 is opened into the clean internal space 101 of the housing 105. Three FOUPs 104 are connected to the housing 105.

As shown in FIG. 14(1), the articulated robot 20 takes out a wafer 21 from a cassette contained in one of the three FOUPs 104. The controller 58 of the articulated robot 20 controls the arm-driving unit 51 and the hand-driving unit 100 so as to move the hand units 27 in a predetermined direction 106 relative to the FOUP 104. The hand units 27 are moved toward the wafer transfer position 103 by keeping the hand units 27 in a predetermined angular position with respect to the housing 105 and changing the angular position thereof with respect to the base 22. After the hand units 27 have held the wafer 21, the articulated robot 20 operates in an operating mode shown in FIGS. 13(2), 13(3) and 14(1) to 14(3) to carry the wafer 21 along a predetermined path to the processing position 102. The hand-driving unit 100 adjusts the angular position of the hand units 27 with respect to the base 22 while articulated robot 20 is carrying the wafer 21 to operate the articulated robot 20 in a narrow working space 107. This carrying operation is reversed to return the wafer 21 from the processing position 102 to the wafer transfer position 103.

The articulated robot 20 provided with the three arms can move the hand units 27 in a moving range wider than a moving range in which the articulated robot 20 provided with the two arms can move the hand units 27. The articulated robot 20 is able to carry a wafer 21 from a cassette contained in any one of the plurality of FOUPs 104 to the processing position.

When an articulated robot 20 provided with two arms is used, the lengths of the two arms must be longer than those of three arms and hence the articulated robot provided with the two arms needs a working area larger than that needed by the articulated robot provided with the three arms. If the two arms and the base are moved by a moving mechanism, the articulated robot needs a large working area and a large floor space. The articulated robot 20 of the present invention needs a small working area and a small floor space.

In some cases, the number of the FOUPs 104 connected to the housing is changed when the number of wafers 21 to be processed and the processing method are changed. In such a case, the distance for which the hand units 27 are moved is shortened. In such a case, the articulated robot provided with the first, the second and the third arm can be readily converted into the articulated robot provided with the second and the third arm simply by removing the first arm from the former. Thus it is possible to deal flexibly with the change of the number of the hoops connected to the housing without replacing the articulated robot with another one.

Since the hand units 27 can be turned relative to the third arm 26, the hand units 27 can be selectively set in a desired position at a predetermined position 27, which improves the convenience of the articulated robot.

The internal space of the housing is narrow. Therefore, the articulated robot needs to be set in the right-hand system or the left-hand system according to the positional relation between the base, the wafer-delivery position and the wafer-feed position to avoid the collision of the hand units against the wall of the housing. Since the base unit 23 can be turned about the pivotal axis L1 with the articulated robot set in a state permitting changing the articulated robot from the right-hand system to the left-hand system and vice versa, the articulated robot can operate in a narrow working area.

Although the invention has been described in its preferred embodiment, various changes and variations are possible in the articulated robot specifically described above. The articulated robot can be used for other purposes other than a purpose of carrying the wafer 21 held by the hand units 27. For example, the articulated robot may be provided with an end effector instead of the hand units to use the articulated robot as a bonding machine or a painting machine. The present invention is applicable to the construction of an articulated actuator capable of moving an end effector in a narrow working area. Since the articulated robot of the present invention can operate in a narrow working area, the articulated robot can be installed in a narrow, limited space, such as the internal space of a housing narrower than a space corresponding to the maximum working area of the robot arm. The maximum working area is defined by a circle swept by the front part of the second arm when the second arm is turned about the first pivotal axis L1 with the second arm extended so that the front part thereof is at the longest distance from the base unit. The first distance R1 between the first pivotal axis L1 and the second pivotal axis L2 may be slightly different from the second distance R2 between the second pivotal axis L2 and the third pivotal axis L3 and the third distance R3 between the third pivotal axis L3 and the fourth pivotal axis L4, provided that the second distance R2 is equal to the third distance R3. The first pivotal axis L1 may be extended in any suitable direction instead of a vertical direction.

The hand units 27 may be interlocked with the third arm so as to be turned according to the turning of the third arm instead of using the hand-driving unit 100 to turn the hand units 27.

Although the invention has been described in its preferred embodiment with a certain degree of particularity, obviously many changes and variations are possible therein. It is therefore to be understood that the present invention may be practiced otherwise than as specifically described herein without departing from the scope and spirit thereof.

What is claimed is:

1. An articulated robot comprising:
a base unit having a predetermined first pivotal axis and capable of turning about the first pivotal axis;
a first arm having a base part fixedly connected to the base unit, and a front part having a second pivotal axis parallel to the first pivotal axis;
a second arm having a base part connected to the front part of the first arm, and a front part having a third pivotal axis parallel to the first pivotal axis, and capable of turning about the second pivotal axis;
a third arm having a base part connected to the front part of the second arm, and a front part having a fourth pivotal axis parallel to the first pivotal axis, and capable of turning about the third pivotal axis;
an interlocking means interlocking the second arm and the third arm such that the third arm turns about the third pivotal axis relative to the second arm in one of opposite directions through an angle twice as large as an angle through which the second arm turns about the second pivotal axis relative to the first arm in the other direction;
a base unit driving means for turning the base unit about the first pivotal axis; and
an arm driving means for turning the second arm about the second pivotal axis;

wherein a distance between the first pivotal axis and the second pivotal axis is equal to a distance between the second pivotal axis and the third pivotal axis;

wherein respective effective lengths of the first arm, the second arm and the third arm are selectively determined such that a radius of a circle occupied by the first, second and third arms and having its center at the first pivotal axis is at a minimum in a state in which the first arm, the second arm and the third arm are in angular positions such that a direction from the base part toward the front part of each of the second arm and the third arm is opposite to a direction from the base part toward the front part of the first arm; and further comprising:

an end effector that comes into contact with a workpiece, having a base part connected to the front part of the third arm, and a front part;

the end effector having a length such that the end effector is contained within the circle when (1) the radius of the circle is at the minimum in the state where the first arm, the second arm and the third arm are in angular positions such that the direction from the base part toward the front part of each of the second arm and the third arm is opposite to the direction from the base part toward the front part of the first arm, and (2) the end effector is in an angular position such that the direction from the base part of the end effector toward the front part of the end effector is the same as the direction from the base part of the first arm toward the front part of the first arm;

an end effector driving means for turning the end effector about the fourth pivotal axis; and the first arm is capable of turning about the first pivotal axis at least 180 degrees.

2. The articulated robot according to claim 1, wherein the first arm is separable from the base unit and the second arm, the base part of the second arm is connectable to the base unit, the second arm is capable of being turned about the first pivotal axis when the second arm is connected to the base unit, and the interlocking means turns the third arm about the third pivotal axis relative to the second arm in one of opposite directions through an angle twice as large as an angle through which the second arm is turned about the first pivotal axis relative to the base unit in the other direction.

3. The articulated robot according to claim 1, wherein the interlocking means includes a gear mechanism capable of transmitting driving force of the arm driving means to the second and the third arm.

4. The articulated robot according to claim 1, wherein the second arm is capable of turning about the second pivotal axis by 360 degrees.

* * * * *